(12) United States Patent
Namatsu et al.

(10) Patent No.: US 7,977,036 B2
(45) Date of Patent: Jul. 12, 2011

(54) RESIST PATTERN FORMING METHOD

(75) Inventors: Hideo Namatsu, Atsugi (JP); Mitsuru Sato, Kawasaki (JP)

(73) Assignees: Nippon Telegraph and Telephone Corporation, Tokyo (JP); Tokyo Ohka Kogyo Co., Ltd., Kanagawa-ken (JP)

( * ) Notice: Subject to any disclaimer, the term of this patent is extended or adjusted under 35 U.S.C. 154(b) by 537 days.

(21) Appl. No.: 11/795,988

(22) PCT Filed: Jan. 27, 2006

(86) PCT No.: PCT/JP2006/301297
§ 371 (c)(1),
(2), (4) Date: Jul. 25, 2007

(87) PCT Pub. No.: WO2006/080428
PCT Pub. Date: Aug. 3, 2006

(65) Prior Publication Data
US 2008/0118871 A1    May 22, 2008

(30) Foreign Application Priority Data
Jan. 27, 2005  (JP) ................. 2005-020375

(51) Int. Cl.
*G03F 7/26* (2006.01)
(52) U.S. Cl. ........................................ 430/325
(58) Field of Classification Search .......... 430/331
See application file for complete search history.

(56) References Cited

U.S. PATENT DOCUMENTS

| 5,939,235 | A | 8/1999 | Kondo et al. |
| 6,177,231 | B1 | 1/2001 | Ishii et al. |
| 2003/0224589 | A1 | 12/2003 | Endo et al. |
| 2004/0018452 | A1 | 1/2004 | Schilling |
| 2004/0087457 | A1 | 5/2004 | Korzenski et al. |
| 2006/0003271 | A1 | 1/2006 | Clark et al. |
| 2006/0063102 | A1 | 3/2006 | Kubota et al. |
| 2006/0127799 | A1 | 6/2006 | Kubota et al. |
| 2006/0134555 | A1 | 6/2006 | Park et al. |

FOREIGN PATENT DOCUMENTS

| JP | H06-148889 A | 5/1994 |
| JP | H06-230574 A | 8/1994 |
| JP | H10-282649 A | 10/1998 |
| JP | 2000-089477 A | 3/2000 |
| JP | 2000-112150 A | 4/2000 |
| JP | 2002-341538 A | 11/2002 |
| JP | 2003-140359 A | 5/2003 |
| JP | 2003-224050 A | 8/2003 |
| JP | 2003-338452 A | 11/2003 |
| JP | 2004-233953 A | 8/2004 |
| JP | 2004-233954 A | 8/2004 |
| JP | 2005-202176 | 7/2005 |
| JP | 2005-223118 A | 8/2005 |
| WO | 03/087936 A | 10/2003 |
| WO | 2004/042472 A2 | 5/2004 |
| WO | WO-2004/051375 A1 | 6/2004 |
| WO | WO-2004/051380 A1 | 6/2004 |
| WO | 2005/072235 A2 | 8/2005 |

OTHER PUBLICATIONS

Yoshimura, Toshiyuki, et al., "Nano edge roughness in polymer resist patterns", Applied Physics Letters, vol. 63, No. 6, pp. 764-766, Aug. 1993.
Dammert, Ritva M., et al., "Free Volume and Tacticity in Polystyrenes", Macromolecules, vol. 32, pp. 1930-1938, 1999.

*Primary Examiner* — Kathleen Duda
(74) *Attorney, Agent, or Firm* — Harness, Dickey & Pierce, P.L.C.

(57) ABSTRACT

A fine and high-accuracy resist pattern, which is excellent in etching resistance, can be formed. Disclosed is a resist pattern forming method, which includes the steps of developing a resist composition having photosensitivity to a predetermined light source through a lithography technique to form a resist pattern 2 on a substrate 1, and bringing the resist pattern 2 into contact with a supercritical processing solution 5' including a supercritical fluid 3' which contains a crosslinking agent 4.

10 Claims, 7 Drawing Sheets

FIG. 6
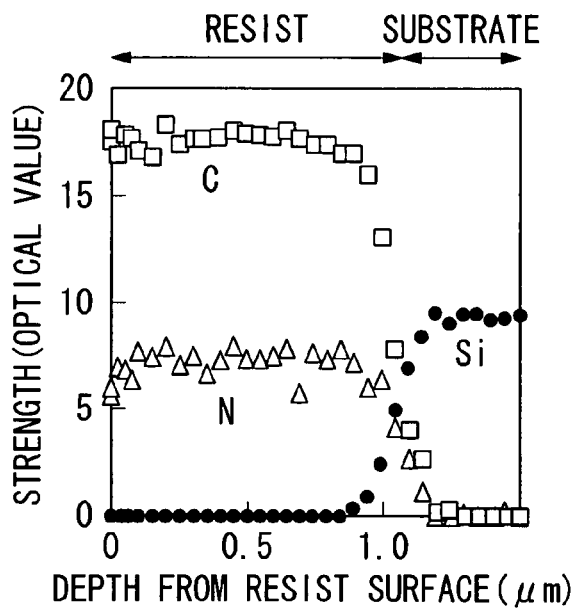
FIG. 7A    FIG. 7B
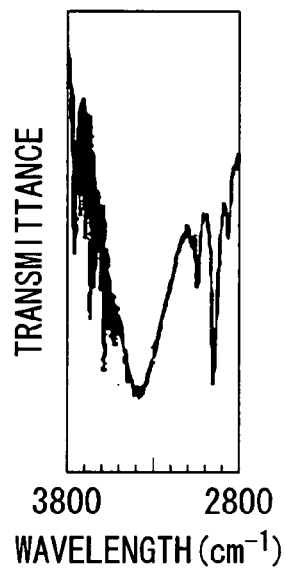
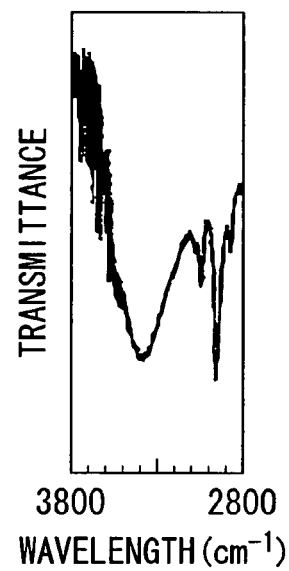

RESIST PATTERN FORMING METHOD

TECHNICAL FIELD

The present invention relates to a resist pattern forming method.

This application claims priority on Japanese Patent Application No. 2005-020375 filed on Jan. 27, 2005, the disclosure of which is incorporated by reference herein.

BACKGROUND ART

In photolithography techniques, for example, there can be performed the steps of forming a resist film made of a resist composition on a substrate, selectively exposing the resist film to radiation such as light or electron beam through a photomask having a predetermined pattern formed thereon, and subjecting to a development treatment to form a resist pattern having a predetermined shape on the resist film. Using this resist pattern as a mask, an insulation film and a conductive film formed on the substrate are partially etched and also the unnecessary resist pattern is removed, and thus transfer of the pattern onto the substrate is completed.

A resist composition in which the exposed area shifts to be soluble in a developer is referred to as a positive resist composition, whereas, a resist composition in which the exposed area shifts to be insoluble in a developer is referred to as a negative resist composition.

In recent years, advances in lithography techniques have led to rapid miniaturization of resist patterns in the production of semiconductor devices and liquid crystal display devices. As means for miniaturization, further progress has been made in shortening of the wavelength of exposure light. Although ultraviolet ray typified by g-ray or i-ray has conventionally been used, KrF excimer laser (248 nm) is introduced at present and also ArF excimer laser (193 nm) is introduced.

To reproduce a pattern having a fine size, a resist material having high resolution is required.

As such a resist material, a chemically amplified resist composition containing a base resin and an acid generator which generates an acid under exposure is used. For example, a positive chemically amplified photoresist contains a resin component which exhibits increased alkali solubility under the action of an acid, and an acid generator component which generates an acid under exposure, and when the acid is generated from the acid generator under exposure during the formation of a resist pattern, the exposed area shifts to an alkali soluble state.

As the resin component of the chemically amplified positive resist composition, there can be commonly used a resin in which a portion of hydroxyl groups of a polyhydroxystyrene-based resin are protected with acid dissociable, dissolution inhibiting groups, and a resin in which a portion of carboxy groups of an acryl-based resin are protected with acid dissociable, dissolution inhibiting groups. As the acid dissociable, dissolution inhibiting groups, there can be used a so-called acetal group, for example, a chain ether group typified by a 1-ethoxyethyl group and a cyclic ether group typified by a tetrahydropyranyl group; a tertiary alkyl group typified by a tert-butyl group; and a tertiary alkoxycarbonyl group typified by a tert-butoxycarbonyl group (see, for example, Patent Reference 1).

However, since a conventional resist composition is insufficient in dry etching resistance, there arises a problem that a resist pattern disappears during etching and etching cannot be performed with high accuracy, resulting in defects of the resist pattern.

Patent Reference 2 (Japanese Unexamined Patent Application, First Publication No. Hei 10-282649) discloses, as means for improving etching resistance of a resist composition, that fullerene is mixed with a resist composition, and a resist pattern is formed using the mixture. Fullerene has properties capable of improving etching resistance.

(Patent Reference 1)
Japanese Unexamined Patent Application, First Publication No. 2002-341538
(Patent Reference 2)
Japanese Unexamined Patent Application, First Publication No. Hei 10-282649

However, according to the prior art, it is difficult to meet both of a demand of forming a fine and high-accuracy resist pattern and a demand of obtaining a resist pattern having high etching resistance. Particularly in a positive resist composition, this problem becomes severe.

The reason is as follows. That is, when a component having etching resistance is combined or mixed during the synthesis of materials of a resist composition or the preparation of the resist composition, it is difficult to form a fine and high-accuracy resist pattern.

For example, a substance having a conjugated double bond such as benzene ring contributes to an improvement in etching resistance. However, since the substance scarcely transmits far-ultraviolet ray having a wavelength of 193 nm, it becomes difficult to perform exposure when the substance is mixed with a resist composition.

Also, a substance having a cyclic structure of carbon atoms has properties capable of improving etching resistance. However, such a substance has low solubility in a developer and can deteriorate developability.

As described above, since it is required to use an exposure light source having a short wave length and to prevent development residue so as to obtain a fine resist pattern, any substance having properties capable of improving etching resistance cannot be mixed with the resist composition. Therefore, a material which enables to form a pattern having a width of 100 nm or less and has high etching resistance has not been found yet.

The present invention has been made so as to solve the above problem and an object thereof is to provide a fine resist pattern which has high accuracy and is excellent in etching resistance.

DISCLOSURE OF THE INVENTION

To achieve the above object, the present invention employed the following compositions.

The present invention provides a resist pattern forming method in which a pattern is formed on a substrate through a lithography technique using a resist composition having photosensitivity to a predetermined light source, the method comprising bringing the resist pattern formed on the substrate into contact with a supercritical processing solution comprising a supercritical fluid containing a crosslinking agent.

According to the present invention, it is possible to form a fine resist pattern which has high accuracy and is excellent in etching resistance.

BRIEF DESCRIPTION OF THE DRAWINGS

FIGS. 5A and 5B are graphs which show the results of Examples, in which FIG. 5A and FIG. 5B are graphs showing an absorption spectrum of a resist pattern before or after a crosslinking agent 1 is subjected to supercritical processing using carbon dioxide and introduced into the resist pattern, respectively.

FIG. 6 is a graph which shows the results of Examples, and also shows distribution of atoms in a resist pattern film after introducing a crosslinking agent 3 into a resist pattern.

FIGS. 7A and 7B are graphs showing the results of Examples, in which FIG. 7B is a graph showing an infrared spectrum after introducing a crosslinking agent 1 into a resist pattern formed by using a resist composition having a polyhydroxystyrene skeleton through supercritical processing, followed by heating; and FIG. 7A is a graph showing a spectrum before heating.

FIG. 9A to 9C are graphs which show the results of Examples, in which FIG. 9A to FIG. 9C are graphs showing a relationship between the content (abscissa axis) of a crosslinking agent introduced into a resist pattern through supercritical processing, and the etching rate ratio (vertical axis).

BRIEF DESCRIPTION OF THE REFERENCE SYMBOLS

Figure 1:
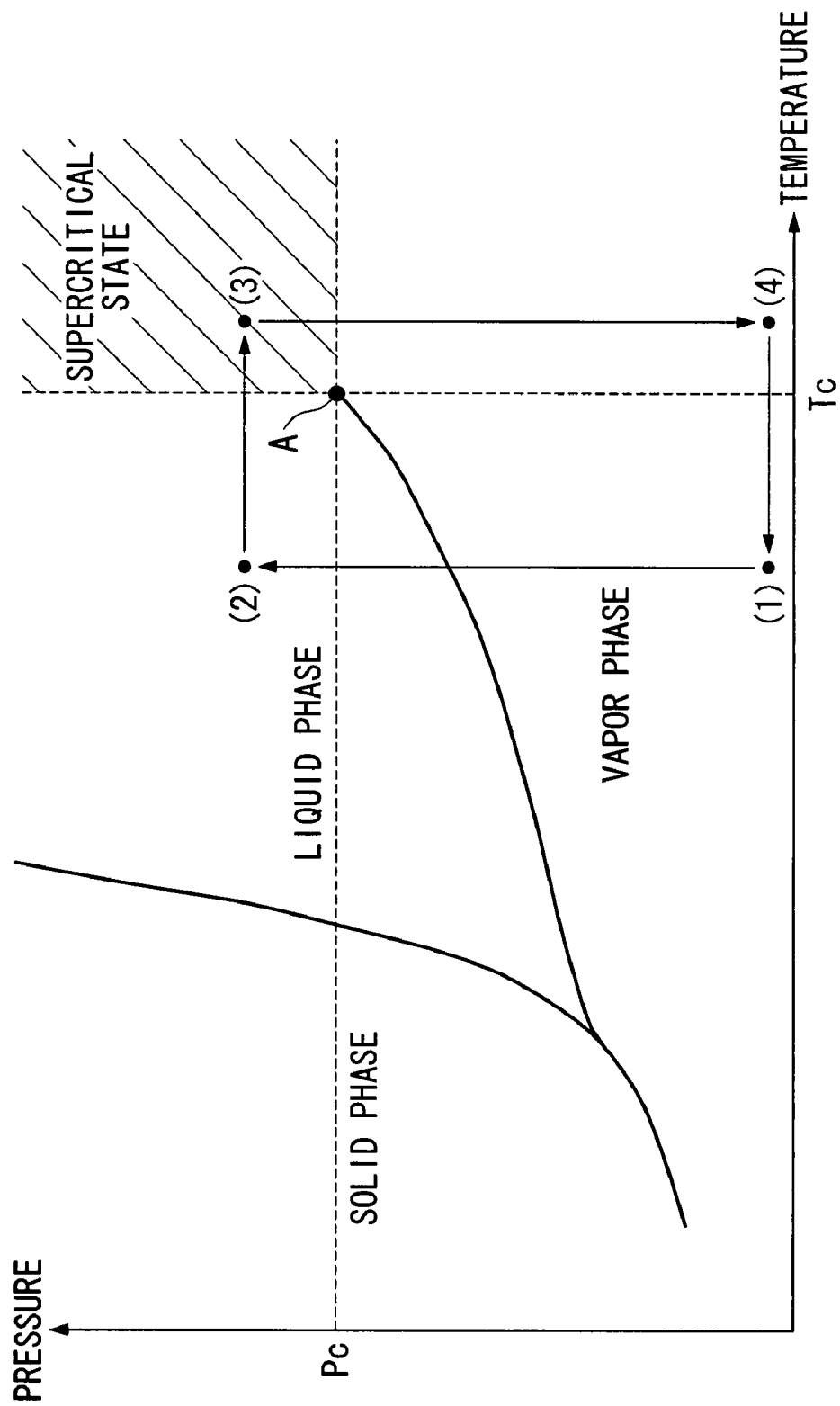
FIG. 1 is a graph showing schematically a vapor-liquid equilibrium curve of a fluid.

1: Substrate
2: Resist pattern
3: Supercritical precursor fluid
3': Supercritical fluid
4: Crosslinking agent
5': Supercritical processing solution
5: Supercritical precursor processing solution
11: Supercritical processing section (high pressure vessel)
12: Supercritical fluid supply system
12': Supercritical precursor fluid supply system
13: Crosslinking agent supplying section
14: Crosslinking agent supplying passage
15: Supplying passage
16: Direct supplying passage
17: Circulating passage
18: Discharge passage

BEST MODE FOR CARRYING OUT THE INVENTION

The present invention provides a resist pattern forming method in which a pattern is formed on a substrate through a lithography technique using a resist composition having photosensitivity to a predetermined light source, the method including bringing the resist pattern formed on the substrate into contact with a supercritical processing solution including a supercritical fluid in which a crosslinking agent is contained.

First Embodiment

The first embodiment of the present invention will now be described by the operation procedure.
[1] Formation of Resist Pattern (Operation Up to Development and Rinsing Treatment)
First, a resist pattern is formed using a resist composition.
Resist Composition
The resist composition used in the present invention may be negative or positive resist composition which has photosensitivity to a light source used in a process for forming a resist pattern, and preferable is a positive resist composition, because an improvement in etching resistance of a positive resist composition is desired. Since a fine pattern can be formed, a chemically amplified resist composition is preferable.

Preferable positive resist composition is obtained by dissolving (A) a resin component, which has acid dissociable, dissolution inhibiting groups and exhibits increased alkali solubility under the action of an acid, and (B) an acid generator which generates an acid under exposure component in (C) an organic solvent.

In the positive resist composition, when the acid generated from the component (B) is reacted, acid dissociable, dissolution inhibiting groups contained in the component (A) are dissociated, and thus the entire component (A) shifts to an alkali soluble state from an alkali insoluble state.

Therefore, in the formation of a resist pattern, when a positive resist composition applied on a substrate is selectively exposed through a mask pattern, alkali solubility of the exposed area enhances and alkali development can be performed.

As the positive resist composition, for example, it is possible to use a positive resist composition for ArF, which is proposed as a resist composition suited for a method of exposing using ArF excimer laser, and a positive resist composition for KrF, which is proposed as a resist composition suited for a method of exposing using KrF excimer laser.

The resin component (A) of the positive resist composition for KrF is commonly composed of a structural unit derived from hydroxystyrene, a structural unit derived from hydroxystyrene in which hydroxyl groups are substituted with acid dissociable, dissolution inhibiting groups, and/or a structural unit derived from a (meth)acrylate ester having acid dissociable, dissolution inhibiting groups, while the resin component (A) of the positive resist composition for ArF is commonly composed of a resin having a structural unit derived from a (meth)acrylate ester having acid dissociable, dissolution inhibiting groups in a main chain.

Herein, a structural unit having a skeleton derived from (meth)acrylic acid in a main chain, such as a structural unit derived from (meth)acrylic acid or a structural unit derived from a (meth)acrylate ester is referred to as an "acryl structural unit". Also, a resin having an "acryl structural unit" is referred to as an "acryl-based resin".

When a resist composition using the "acryl-based resin" is used, the etching resistance generally tends to be decreased. Therefore, the present invention is preferably applied to the resist composition using the "acryl-based resin"

The present invention is applied to an "acryl-based resin" in which the content of the "acryl structural unit" in the resin component is preferably 50 mol % or more, more preferably 80 mol % or more, and further more preferably 100 mol %. Since the resin component of such a type is widely used for ArF excimer laser, the present invention is preferably applied to an ArF excimer laser process.

In the present specification, "(meth)acrylic acid" means either or both of methacrylic acid and acrylic acid, while "(meth)acrylate ester" means either or both of a methacrylate ester and an acrylate ester. A "structural unit" means a monomer unit constituting a polymer.
Resin Component (A)
The component (A) can be used in combination with a plurality of monomer units having different functions, for example, the following structural units:
a structural unit having acid dissociable, dissolution inhibiting groups (hereinafter referred to as a first structural unit or a structural unit (a1)),
a structural unit containing a lactone unit (hereinafter referred to as a second structural unit or a structural unit (a2)), a structural unit having an alcoholic hydroxyl group-containing polycyclic group (hereinafter referred to as a third structural unit or a structural unit (a3)), and a structural unit having a polycyclic group (hereinafter referred to as a fourth structural unit or a structural unit (a4)) which is different from any of the acid dissociable, dissolution inhibiting groups of the first structural unit, a lactone unit of the second structural unit, and the alcoholic hydroxyl group-containing polycyclic group of the third structural unit.

In the present specification, a "lactone unit" means a group in which one hydrogen atom is eliminated from a monocyclic or polycyclic lactone.

A structural unit (a1) is essential and structural units (a2) to (a4) can be appropriately used in combination according to required properties.

A structural unit (a1) may be used in combination with either a structural unit (a2) or (a3). A combination of structural units (a1), (a2) and (a3) is preferable in view of ease of proceeding of the reaction with a crosslinking agent, etching resistance, resolution, and adhesion of a resist film with a substrate.

Furthermore, three kinds of the structural units (a1), (a2) and (a3) preferably account for 80 mol % or more, and more preferably 90 mol % or more, of the component (A).

Furthermore, the component (A) preferably contains a structural unit (a4) because of excellent resolution from an isolation pattern to a semidense pattern (line-and-space pattern in which a space width is from 1.2 to 2, relative to a line width of 1).

Also, with respect to each of structural units (a1) to (a4), plural kinds may be used in combination.

First Structural Unit (a1)

A first structural unit (a1) of the component (A) may be a structural unit derived from a (meth)acrylate ester having acid dissociable, dissolution inhibiting groups, and may be a structural unit derived from hydroxystyrene in which hydroxyl groups are substituted with acid dissociable, dissolution inhibiting groups.

Acid dissociable, dissolution inhibiting groups in the structural unit (a1) can be used without any limitation as long as the groups have alkali dissolution inhibitory properties capable of making the entire component (A) to be alkali insoluble before exposure, and are dissociated under the action of an acid generated from the component (B) after exposure, thereby making the entire component (A) to be alkali soluble. Commonly, a group capable of forming a cyclic or chain tertiary alkyl ester with a carboxy group of (meth)acrylic acid or a hydroxyl group of hydroxystyrene, a tertiary alkoxycarbonyl group, and a chain alkoxyalkyl group is widely known as acid dissociable, dissolution inhibiting groups.

As the structural unit (a1), for example, a structural unit which has acid dissociable, dissolution inhibiting groups having a polycyclic group and is derived from a (meth)acrylate ester can be preferably used.

Examples of the polycyclic group include groups in which one or more hydrogen atoms are eliminated from bicycloalkane, tricycloalkane and tetracycloalkane. Specific examples thereof include groups in which one hydrogen atom is eliminated from a polycycloalkane such as adamantane, norbornane, isobornane, tricyclodecane or tetracyclododecane.

The polycyclic group can be used by appropriately selecting from those proposed in an ArF resist. Among these, an adamantyl group, a norbornyl group and a tetracyclododecanyl group are preferable from an industrial point of view.

It also includes a tert-butyl group; a carboxy-tert-butyl group; a group in which the 1-position of cyclohexane is substituted with a linear or branched lower alkyl group having 1 to 6 carbon atoms and also one hydrogen atom is eliminated; and a cyclic acetal group such as a tetrahydropyranyl group and a tetrahydrofuranyl group.

As the structural unit (a1), for example, a structural unit derived from hydroxystyrene in which a hydroxyl group is substituted with an acid dissociable, dissolution inhibiting group can be preferably used.

Monomer units suited for the first structural unit (a1) are shown in the following formulas (I) to (III) and (a1-1) to (a1-11):

[Chemical Formula 1]

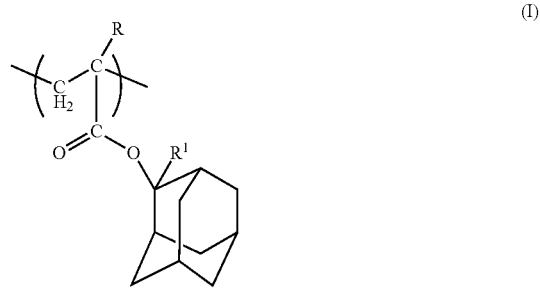

(I)

wherein R represents a hydrogen atom or a methyl group, and $R^1$ represents a lower alkyl group,

[Chemical Formula 2]

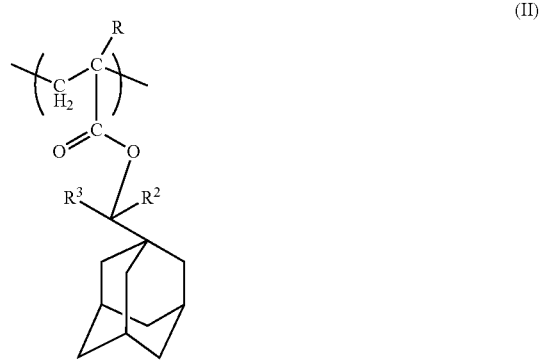

(II)

wherein R represents a hydrogen atom or a methyl group, and $R^2$ and $R^3$ each independently represents a lower alkyl group,

[Chemical Formula 3]

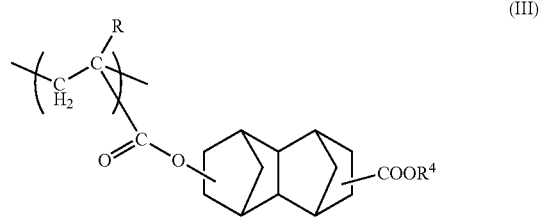

(III)

wherein R represents a hydrogen atom or a methyl group, and $R^4$ represents a tertiary alkyl group,

[Chemical Formula 4]

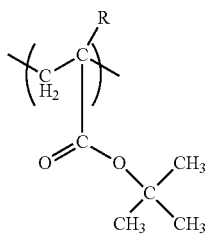

(a1-1)

wherein R represents a hydrogen atom or a methyl group,

[Chemical Formula 5]

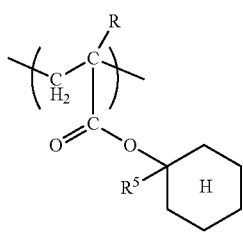

(a1-2)

wherein R represents a hydrogen atom or a methyl group, $R^5$ represents a methyl group, and a six-membered ring at the center of which H is included represents a cyclohexyl ring.

[Chemical Formula 6]

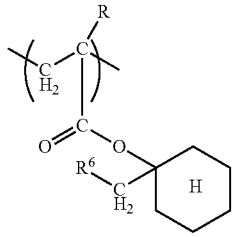

(a1-3)

wherein R represents a hydrogen atom or a methyl group, $R^6$ represents a lower alkyl group, and a six-membered ring at the center of which H is included represents a cyclohexyl ring.

[Chemical Formula 7]

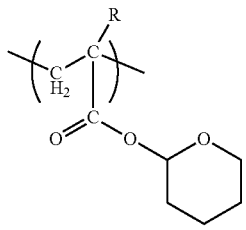

(a1-4)

wherein R represents a hydrogen atom or a methyl group,

[Chemical Formula 8]

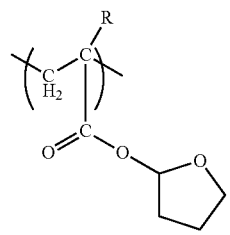

(a1-5)

wherein R represents a hydrogen atom or a methyl group,

[Chemical Formula 9]

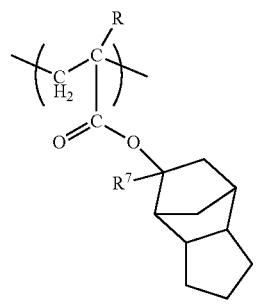

(a1-6)

wherein R represents a hydrogen atom or a methyl group, and $R^7$ represents a lower alkyl group,

[Chemical Formula 10]

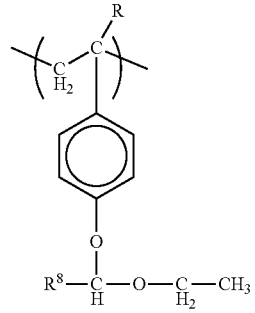

(a1-7)

wherein R represents a hydrogen atom or a methyl group, and $R^8$ represents a lower alkyl group,

[Chemical Formula 11]

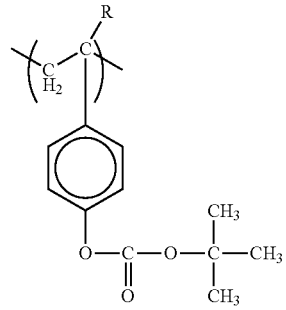

(a1-8)

wherein R represents a hydrogen atom or a methyl group,

[Chemical Formula 12]

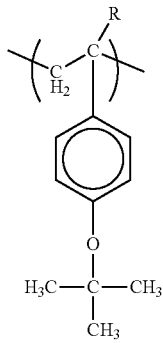

(a1-9)

wherein R represents a hydrogen atom or a methyl group,

[Chemical Formula 13]

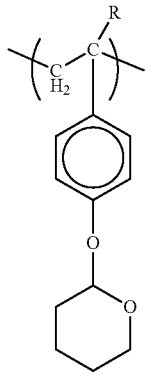

(a1-10)

wherein R represents a hydrogen atom or a methyl group, and

[Chemical Formula 14]

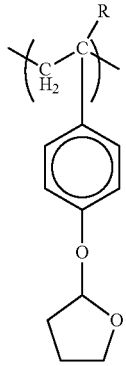

(a1-11)

wherein R represents a hydrogen atom or a methyl group.

The Above $R^1$ to $R^3$ and $R^6$ to $R^8$ each independently is preferably a lower linear or branched alkyl group having 1 to 5 carbon atoms, and examples thereof include a methyl group, an ethyl group, a propyl group, an isopropyl group, an n-butyl group, an isobutyl group, a tert-butyl group, a pentyl group, an isopentyl group, and a neopentyl group. From industrial point of view, a methyl group or an ethyl group is preferable.

$R^4$ is a tertiary alkyl group such as a tert-butyl group or a tert-amyl group, and is preferably a group having 4 to 7 carbon atoms, and more preferably a tert-butyl group from an industrial point of view.

As the first structural unit (a1), structural units represented by the general formulas (I), (II) and (III) are particularly preferable because a resist pattern formed after the development treatment is excellent in resolution.

The structural unit (a1) can be used alone, or two or more kinds of them can be used in combination.

Second Structural Unit (a2)

The second structural unit (a2) of the component (A) has a lactone unit and is therefore effective to enhance adhesion between a resist film and a substrate and to enhance hydrophilicity with a developer.

As the structural unit (a2), any structural unit which have a lactone unit and is copolymerizable with the other structural unit of the component (A) can be used.

The monocyclic lactone unit includes, for example, a group in which one hydrogen atom is eliminated with γ-butyrolactone. Also, the polycyclic lactone unit includes, for example, a group in which one hydrogen atom is eliminated from a lactone-containing bicycloalkane.

As the structural unit (a2), a structural unit which has a lactone unit and is derived from a (meth)acrylate ester is preferably used.

Monomer units suited for a second structural unit (a2) are shown in the following formulas (a2-1) to (a2-3):

[Chemical Formula 15]

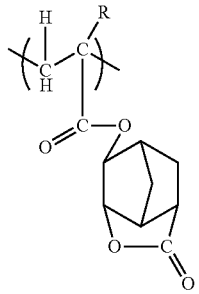

(a2-1)

wherein R represents a hydrogen atom or a methyl group,

[Chemical Formula 16]

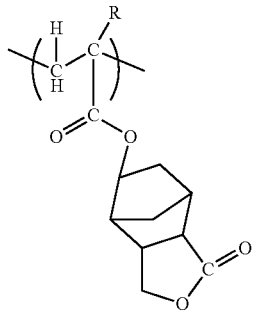

(a2-2)

wherein R represents a hydrogen atom or a methyl group,

[Chemical Formula 17]

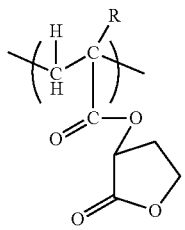

(a2-3)

wherein R represents a hydrogen atom or a methyl group

Among these, a γ-butyrolactone ester of (meth)acrylic acid having an ester bond in a carbon, and a norbornanelactone ester represented by the formula (a2-1) and (a2-2) are particularly preferable, because is available from an industrial point of view.

The structural unit (a2) can be used alone, or two or more kinds of them can be used in combination.

Third Structural Unit (a3)

Since a hydroxyl group in an alcoholic hydroxyl group-containing polycyclic group in the third structural unit (a3) of the component (A) is a polar group, by using the third structural unit (a3), hydrophilicity of the entire component (A) with a developer is enhanced, and alkali solubility in the exposed area is improved. Therefore, the structural unit (a3) contributes to an improvement in resolution. Also, this hydroxyl group reacts with a crosslinking agent, thereby improving the strength of a resist pattern.

The polycyclic group in the structural unit (a3) can be used by appropriately selected from the same polycyclic groups as those exemplified in the description of the first structural unit (a1).

The alcoholic hydroxyl group-containing polycyclic group in the structural unit (a3) is not specifically limited, but a hydroxyl group-containing adamantyl group is preferably used.

Furthermore, this hydroxyl group-containing adamantyl group is preferably represented by the following general formula (IV) because it has the effect of increasing dry etching resistance and enhancing rectangularity of the cross-sectional shape for the resulting resist pattern:

[Chemical Formula 18]

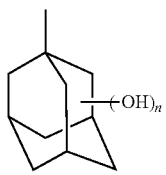

(IV)

wherein n represents an integer of 1 to 3.

As the third structural unit (a3), any structural unit which has the above-described alcoholic hydroxyl group-containing polycyclic group and can be copolymerized with the other structural unit of the component (A) can be used.

Particularly, a structural unit derived from a (meth)acrylate ester is preferable.

Specifically, a structural unit represented by the following general formula (IVa) is preferable:

[Chemical Formula 19]

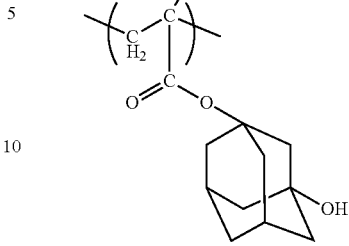

(IVa)

wherein R represents a hydrogen atom or a methyl group.

The structural unit (a3) can be used alone, or two or more kinds of them can be used in combination.

Fourth Structural Unit (a4)

In the fourth structural unit (a4), the polycyclic group which is different from any of "the acid dissociable, dissolution inhibiting groups, the lactone unit, and the alcoholic hydroxyl group-containing polycyclic group" means that, in the component (A), the polycyclic group of the structural unit (a4) does not overlap with any of acid dissociable, dissolution inhibiting groups of the first structural unit, the lactone unit of the second structural unit, and the alcoholic hydroxyl group-containing polycyclic group of the third structural unit, and also means that the structural unit (a4) does not possess any of acid dissociable, dissolution inhibiting groups of the first structural unit, the lactone unit of the second structural unit and the alcoholic hydroxyl group-containing polycyclic group of the third structural unit, which constitute the component (A).

As the polycyclic group in the structural unit (a4), any polycyclic group which is selected so as not to overlap with the structural unit used as the structural units (a1) to (a3) in a component (A) can be used, and is not specifically limited. For example, as polycyclic group in the structural unit (a4), the same polycyclic group as those exemplified as the structural unit (a1) can be used and it is possible to use those which have conventionally been known as an ArF positive resist material.

It is particularly preferable that the polycyclic group is at least one selected from a tricyclodecanyl group, an adamantyl group, and a tetracyclododecanyl group, because it is easily available from an industrial point of view.

As the structural unit (a4), any structural unit which has the above-described polycyclic group and can be copolymerized with the other structural unit of the component (A) can be used.

Preferable examples of the structural unit (a4) are shown in the following formulas (a4-1) to (a4-3):

[Chemical Formula 20]

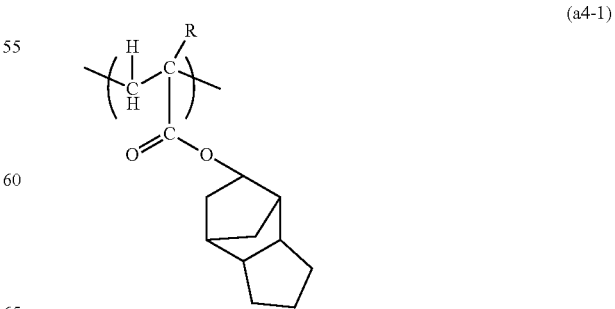

(a4-1)

wherein R represents a hydrogen atom or a methyl group,

[Chemical Formula 21]

(a4-2)

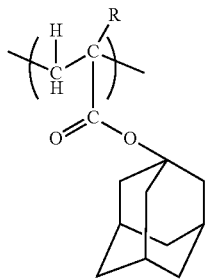

wherein R represents a hydrogen atom or a methyl group, and

[Chemical Formula 22]

(a4-3)

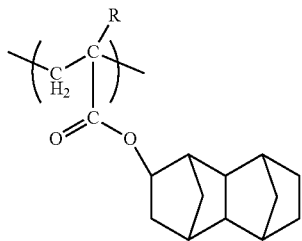

wherein R represents a hydrogen atom or a methyl group.

The structural unit (a4) can be used alone, or two or more kinds of them can be used in combination.

As to the composition of the component (A), the content of the first structural unit (a1) is preferably from 20 to 60 mol %, and more preferably from 30 to 50 mol %, relative to the total structural units constituting the component (A), because excellent resolution is obtained.

Also, the content of the second structural unit (a2) is preferably from 20 to 60 mol %, and more preferably from 30 to 50 mol %, relative to the total structural units constituting the component (A), because excellent resolution is obtained.

Also, the content of the third structural unit (a3) is preferably from 5 to 50 mol %, and more preferably from 10 to 40 mol %, relative to the total structural units constituting the component (A), because excellent resist pattern shape is obtained. It is also preferable because hydroxyl groups of the structural unit (a3) react with a crosslinking agent and the crosslinking reaction easily proceeds.

When the fourth structural unit (a4) is used, the content is preferably from 1 to 30 mol %, and more preferably from 5 to 20 mol %, relative to the total structural units constituting the component (A), because resolution from an isolation pattern to a semidense pattern is excellent.

A weight-average molecular weight (polystyrene equivalent value, the same shall apply hereinafter) of the resin component (A) is not specifically limited, and is preferably set within a range from 5,000 to 30,000, and more preferably from 8,000 to 20,000. When the weight-average molecular weight is more than the above range, solubility in a resist solvent may deteriorate. When the weight-average molecular weight is less than the above range, a cross-sectional shape for the resulting resist pattern may deteriorate.

The resin component (A) can be easily prepared by copolymerizing monomers corresponding to a structural unit (a1) as an essential component and the respective structural units (a2), (a3), and/or (a4) through known radical polymerization methods using a radical polymerization initiator such as azobisisobutyronitrile (AIBN). It is particularly preferred that the resin component (A) contains at least one kind selected from the above general formulas (I) to (III) as the structural unit (a1).

Also, the content of the alkali-soluble unit in the component (A) can be adjusted to less than 20 mol %, by adjusting the content of the monomer having the alkali-soluble unit to less than 20 mol % relative to the entire monomer to be copolymerized.

The component (A) can be used alone, or two or more kinds of them can be used in combination.

Acid Generator Component (B)

The acid generator component (B) can be used by appropriately selecting from those which have conventionally been known as an acid generator in a chemically amplified photoresist.

As the acid generator, there are known various acid generators, for example, an onium salt-based acid generator such as iodonium salt or sulfonium salt; an oximesulfonate-based acid generator; a diazomethane-based acid generator such as bisalkyl or bisarylsulfonyldiazomethanes or poly(bissulfonyl)diazomethanes; a nitrobenzylsulfonate-based acid generator; an iminosulfonate-based acid generator; and a disulfone-based acid generator.

Among the diazomethane-based acid generator, specific examples of the bisalkyl or bisarylsulfonyldiazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Examples of the poly(bissulfonyl)diazomethanes include 1,3-bis(phenylsulfonyldiazomethylsulfonyl)propane (in the case of A=3), 1,4-bis(phenylsulfonyldiazomethylsulfonyl)butane (in the case of A=4), 1,6-bis(phenylsulfonyldiazomethylsulfonyl)hexane (in the case of A=6), 1,10-bis(phenylsulfonyldiazomethylsulfonyl)decane (in the case of A=10), 1,2-bis(cyclohexylsulfonyldiazomethylsulfonyl)ethane (in the case of B=2), 1,3-bis(cyclohexylsulfonyldiazomethylsulfonyl)propane (in the case of B=3), 1,6-bis(cyclohexylsulfonyldiazomethylsulfonyl)hexane (in the case of B=6), and 1,10-bis(cyclohexylsulfonyldiazomethylsulfonyl)decane (in the case of B=10), each having structures shown in the following formula (B1).

[Chemical Formula 23]

(B1)

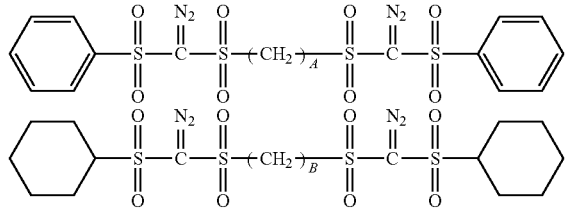

Specific examples of the onium salt-based acid generator include trifluoromethane sulfonate or nonafluorobutane sulfonate of diphenyliodonium; trifluoromethane sulfonate or nonafluorobutane sulfonate of bis(4-tert-butylphenyl)iodonium; trifluoromethane sulfonate of triphenylsulfonium, heptafluoropropane sulfonate thereof, or nonafluorobutane sulfonate thereof; trifluoromethane sulfonate of tri(4-methylphenyl)sulfonium, heptafluoropropane sulfonate thereof, or nonafluorobutane sulfonate thereof; trifluoromethane sulfonate of dimethyl(4-hydroxynaphthyl)sulfonium, heptafluoropropane sulfonate thereof, or nonafluorobutane sulfonate thereof; trifluoromethane sulfonate of monophenyldimethylsulfonium, heptafluoropropane sulfonate thereof, or nonafluorobutane sulfonate thereof; trifluoromethane sulfonate of diphenylmonomethylsulfonium, heptafluoropropane sulfonate thereof, or nonafluorobutane sulfonate thereof; trifluoromethane sulfonate of (4-methylphenyl)diphenylsulfonium, heptafluoropropane sulfonate thereof, or nonafluorobutane sulfonate thereof; trifluoromethane sulfonate of (4-methoxyphenyl)diphenylsulfonium, heptafluoropropane sulfonate thereof, or nonafluorobutane sulfonate thereof; trifluoromethane sulfonate of tri(4-tert-butyl)phenylsulfonium, heptafluoropropane sulfonate thereof, or nonafluorobutane sulfonate thereof; and trifluoromethane sulfonate of diphenyl(1-(4-methoxy)naphthyl)sulfonium, heptafluoropropane sulfonate thereof, or nonafluorobutane sulfonate thereof.

As the component (B), one kind of acid generator may be used alone, or two or more kinds of acid generators may be used in combination.

The amount of the component (B) is adjusted within a range from 0.5 to 30 parts by mass, and preferably from 1 to 10 parts by mass, relative to 100 parts by mass of the component (A). When the amount is less than 0.5 parts by mass, a pattern is not sufficiently formed. On the other hand, when the amount is more than 30 parts by mass, it is difficult to obtain a uniform solution, and the deterioration of storage stability may be caused.

Organic Solvent (C)

The positive resist composition can be prepared by dissolving the component (A), the component (B), an optional component (D) described hereinafter, and the like in an organic solvent (C).

The organic solvent (C) may be any solvent which can dissolve the component (A) and the component (B) to give a uniform solution, and can be used by appropriately selecting one or more kinds from those which have conventionally been known as a solvent of a chemically amplified photoresist.

Examples of the organic solvent (C) include ketones such as acetone, methyl ethyl ketone, cyclohexanone, methyl isoamyl ketone, and 2-heptanone; polyhydric alcohols and derivatives thereof, such as ethylene glycol, ethylene glycol monoacetate, diethylene glycol, diethylene glycol monoacetate, propylene glycol, propylene glycol monoacetate, dipropylene glycol, or monomethyl ether, monoethyl ether, monopropyl ether, monobutyl ether or monophenyl ether of dipropylene glycol monoacetate, propylene glycol monomethyl ether acetate (PGMEA), and propylene glycol monomethyl ether (PGME); cyclic ethers such as dioxane; esters such as methyl lactate, ethyl lactate, methyl acetate, ethyl acetate, butyl acetate, methyl pyruvate, ethyl pyruvate, methyl methoxypropionate, and ethyl ethoxypropionate; and lactones such as γ-butyrolactone. These organic solvents may be used alone, or as a mixed solvent of two or more kinds of solvents.

A mixed solvent prepared by mixing propylene glycol monomethyl ether acetate (PGMEA) with a polar solvent having a hydroxy group or lactone, such as propylene glycol monomethyl ether (PGME), ethyl lactate (EL) or γ-butyrolactone is preferable because storage stability of the positive resist composition is improved. In the case of mixing PGMEA with EL, a mass ratio PGMEA:EL is preferably from 1:9 to 9:1.

In the case of mixing PGMEA with PGME, a mass ratio PGMEA:PGME is preferably from 1:9 to 9:1, and more preferably from 2:8 to 8:2.

In the case of a component (A) containing all structural units (a1) to (a4), a mixed solvent of PGMEA and PGME is preferable, because storage stability of the positive resist composition is improved.

The component (C) is preferably a mixed solvent of at least one kind selected from among PGMEA and ethyl lactate (EL), and γ-butyrolactone. In this case, a mass ratio of the former to the latter is preferably from 70:30 to 95:5.

The component (C) can be used alone, or two or more kinds of them can be used in combination.

In the positive resist composition, the content of the organic solvent (C) is appropriately set according to the thickness of a resist film, so as to adjust the solid content of the resist composition within a range from 3 to 30% by mass.

Other Components

The positive resist composition can further contains (D) a nitrogen-containing organic compound as an optional component so as to improve resist pattern shape and post exposure stability of the latent images formed by the pattern-wise exposure of the resist layer. The nitrogen-containing organic compound is preferably a secondary lower aliphatic amine or a tertiary lower aliphatic amine.

Here, a lower aliphatic amine means an alkyl or alkyl alcohol amine with an alkyl or alkyl alcohol having 5 or less carbon atoms, and examples of the secondary or tertiary amine include trimethylamine, diethylamine, triethylamine, di-n-propylamine, tri-n-propylamine, tripentylamine, diethanolamine, and triethanolamine, among which an alkanolamine such as triethanolamine is particularly preferable.

These amines are used alone or in combination.

The content of the component (D) is commonly within a range from 0.01% to 1.0% by mass relative to the component (A).

For the purpose of preventing deterioration of sensitivity caused by mixing of the component (D) and improving resist pattern shape and post exposure stability of the latent images formed by the pattern-wise exposure of the resist layer, the positive resist composition can further contain an acidic component as a component (E).

The component (E) includes an organic carboxylic acid, or a phosphorus oxo acid or a derivative thereof. The component (D) and the component (E) can be used in combination, or either one can also be used alone.

Examples of suitable organic carboxylic acids include malonic acid, citric acid, malic acid, succinic acid, benzoic acid, and salicylic acid.

Examples of the phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, among which phosphonic acid is particularly preferable.

The component (E) can be used alone, or two or more kinds of them can be used in combination, and is used within a range from 0.01 to 5.0 parts by mass relative to 100 parts by mass of the component (A).

Other miscible additives can also be added to the positive resist composition of the present invention, if necessary, and examples thereof include additive resins for improving the properties of the resist film, surfactants for improving the applicability, dissolution inhibitors, plasticizers, stabilizers, colorants, and halation prevention agents.

Formation of Resist Pattern

Next, formation of a resist pattern (from application of a resist composition to a development treatment) will now be described.

First, on a substrate such as silicon wafer, a positive resist composition is applied in a thickness of about 50 to 1,000 nm using a spinner, and then prebaked.

Using an exposure apparatus, the film of the positive resist composition is selectively exposed and then post exposure bake (PEB) is performed. This selective exposure includes exposure to the following exposure light through a mask pattern, irradiation with electron beam through a mask pattern, and drawing through electron beam without using a mask pattern. In this example, for example, a line-and-space pattern having a width of 90 nm is formed.

Subsequently, a development treatment is performed.

That is, a development treatment is performed using an alkali developer of an aqueous alkali solution and then water rinsing is performed using pure water. In the case of water rinsing, for example, water is dropped or sprayed on the surface of the substrate while rotating the substrate, thereby washing out the developer and the resist composition dissolved by the developer on the substrate. As a result, the film of the positive resist composition is patterned into a shape corresponding to a mask pattern to obtain an undried resist pattern.

The above steps can be performed using a known technique. It is preferred that operation conditions are appropriately set according to the composition and properties of the resist composition to be used.

The light source used in exposure is not specifically limited and the exposure can be performed using radiations such as ArF excimer laser, KrF excimer laser, $F_2$ excimer laser, EUV (Extreme Ultra Violet), VUV (Vacuum Ultra Violet), electron beam, X-ray and soft X-ray radiation. The positive resist composition of the above example is particularly effective for KrF excimer laser, ArF excimer laser, and electron beam. It is preferred to be applied, when a resist composition for ArF excimer laser process which is particularly inferior in etching resistance is used.

Between the substrate and the film of the resist composition, an organic or inorganic antireflection film can also be provided.

Water rising after the development treatment can be omitted, but an alkali component in an alkali developer is preferably washed out by performing a water rinsing step.

[2] Contact of Resist Pattern with Supercritical Processing Solution

Then, a resist pattern is brought into contact with a "supercritical processing solution".

The "supercritical processing solution" means a solution prepared by mixing a supercritical fluid with a crosslinking agent.

Supercritical Processing Solution

Supercritical Fluid

As a supercritical fluid, any substance which has a critical temperature at which a resist film is not thermally deformed can be used, whether the supercritical fluid is in the state of liquid or vapor at normal temperature under normal pressure. Commonly, a substance having a critical temperature of 100° C. or lower is suitable.

The supercritical fluid may be vapor or liquid in an atmospheric environment, and is preferably vapor. Also, a substance which is in a state of a supercritical fluid under the condition of predetermined temperature and pressure is preferable. The "atmospheric environment" is commonly a state referred to as a normal atmosphere and, for example, it is a state of an earth surface (land surface) pressure of 1013.25 hPa and a land surface temperature of 15° C.

As the supercritical fluid, for example, a fluid having a critical temperature of 0° C. or higher, a critical pressure of preferably 50 MPa or less, particularly 40 MPa or less, and still preferably 30 MPa or less, is used.

In the supercritical fluid used in the supercritical processing solution, the crosslinking agent preferably has high solubility.

Specific examples thereof include $CO_2$ (carbon dioxide), $H_2O$, $C_3H_6$, $N_2O$, and a fluorine compound such as fluoroform ($CHF_3$), $SF_6$, $CH_2F_5$ or $CHF_2OCH_3$. A critical temperature (hereinafter sometimes referred to as Tc) and a critical pressure (hereinafter sometimes referred to as Pc) of these fluids are as follows.

$CO_2$: Tc=31.1° C., Pc=about 7.38 MPa (72.8 atm),
$H_2O$: Tc=374° C., Pc=about 22.0 MPa (217.6 atm),
$C_3H_6$: Tc=92.3° C., Pc=about 4.6 MPa (45.6 atm),
$N_2O$: Tc=36.5° C., Pc=about 7.27 MPa (71.7 atm),
$CHF_3$: Tc=25.9° C., Pc=about 4.84 MPa (47.8 atm),
$SF_6$: Tc=45.5° C., Pc=about 3.75 MPa,
$C_2HF_5$: Tc=66.3° C., Pc=about 3.62 MPa,
$CF_3CH_2OCH_3$: Tc=176° C., Pc=about 3.62 MPa, and
$CF_3CF_2OCH_3$: Tc=133.8° C., Pc=about 2.89 MPa Among these fluids, $CO_2$ is preferable in view of solubility of the crosslinking agent and industrial use conditions.

Hereinafter, description will be made with reference to the case of mainly using $CO_2$.

Crosslinking Agent

As a crosslinking agent, any crosslinking agent which has a functional group capable of reacting with the component (A) to form a crosslinked structure can be used without any limitation. Also, the crosslinking agents may cause a crosslinking reaction.

The crosslinking agent reacts, for example, with an alcoholic hydroxyl group, a phenolic hydroxyl group, or a carboxy group of the component (A).

The phenolic hydroxyl group exists, for example, in a structural unit derived from hydroxystyrene.

Also, for example, in the structural unit derived from a (meth)acrylate ester protected with acid dissociable, dissolution inhibiting groups, a portion of dissolution inhibiting groups are separated by the treatment such as exposure and heating, and converted into carboxy groups. The crosslinking agent can react with the carboxy group.

Also, in the structural unit in which hydroxyl groups of the hydroxystyrene structural unit are substituted with acid dissociable, dissolution inhibiting groups, a portion of acid dissociable, dissolution inhibiting groups are converted into hydroxyl groups similarly by separation of the dissolution inhibiting groups. Then, the hydroxyl groups can be reacted with the crosslinking agent.

When the structural unit (a3) is used, etching resistance can be improved by reacting the alcoholic hydroxyl group with the crosslinking agent.

Specific examples of the crosslinking agents include aliphatic cyclic hydrocarbon having either or both of a hydroxy group and a hydroxyalkyl group, such as 2,3-dihydroxy-5-hydroxymethylnorbornane, 2-hydroxy-5,6-bis(hydroxymethyl)norbornane, cyclohexanedimethanol, 3,4,8 (or 9)-trihydroxytricyclodecane, 2-methyl-2-adamantanol, 1,4-dioxane-2,3-diol, and 1,3,5-trihydroxycyclohexane, or oxygen-containing derivative thereof.

The crosslinking agents also includes an amino-based crosslinking agent and a vinyl-based crosslinking agent.

The crosslinking agent further includes a fullerene compound.

As the fullerene compound, any fullerene compound which has a group capable of causing a crosslinking reaction can be used, and examples thereof include those having a functional group used in the amino-based crosslinking agent, and a functional group such as vinyl group used in the vinyl-based crosslinking agent, and those described in the Patent Document 2 (Japanese Unexamined Patent Application, First Publication No. Hei 10-282649).

Also, among these crosslinking agents, a crosslinking agent containing at least one kind selected from the group consisting of a fullerene compound, an amino-based crosslinking agent, and a vinyl-based crosslinking agent is preferable.

Furthermore, a crosslinking agent containing at least one kind selected from the group consisting of an amino-based crosslinking agent and a vinyl-based crosslinking agent is more preferable.

The vinyl-based crosslinking agent is preferably a vinyl-based crosslinking agent having two or more vinyl groups, and more preferably a crosslinkable polyvinyl ether compound which has two or more vinyl group and an ether group.

Various polyvinyl ether compounds are described in Japanese Unexamined Patent Application, First Publication No. Hei 6-148889 and Japanese Unexamined Patent Application, First Publication No. Hei 6-230574, and can be used by optionally selecting from these compounds.

Among these compounds, preferable compound is a compound in which a portion or all of vinyl groups of an alcohol represented by the general formula (F-0-1):

(F-0-1)

wherein $R^0$ represents a group in which m hydrogen atoms are eliminated from an alkane having a linear group, a branched group or a cyclic group, or a group in which m hydrogen atoms are eliminated from an aromatic ring, and m represents an integer of 2, 3 or 4,
are etherified with vinyl groups.

The number of carbon atoms of $R^0$ is preferably from 1 to 20.

In the "group in which m hydrogen atoms are eliminated from an aromatic ring", the aromatic ring includes a benzene ring and a naphthalene ring, among which a benzene ring is preferable.

Specific examples of the compound include ethylene glycol divinyl ether, triethylene glycol divinyl ether, 1,3-butanediol divinyl ether, tetramethylene glycol divinyl ether, neopentyl glycol divinyl ether, trimethylolpropane trivinyl ether, trimethylolethane trivinyl ether, hexanediol divinyl ether, 1,4-cyclohexanediol divinyl ether, tetraethylene glycol divinyl ether, pentaerythritol divinyl ether, pentaerythritol trivinyl ether, and cyclohexanedimethanol divinyl ether. Among these, a crosslinkable divinyl ether compound is more preferable and a cyclohexanedimethanol divinyl ether is particularly preferable.

A compound (F-1) described hereinafter is also preferable.

An amino-based crosslinking agent preferably has two or more structures derived from an amino group.

The amino-based crosslinking agents includes, for example, a compound obtained by reacting an amino group-containing compound such as melamine, acetoguanamine, benzoguanamine, urea, ethyleneurea, propyleneurea or glycol urile with formaldehyde or formaldehyde and a lower alcohol, to substitute hydrogen atoms of the amino group with a hydroxymethyl group or a lower alkoxymethyl group.

Among these crosslinking agents, a crosslinking agent using melamine is referred to as a melamine-based crosslinking agent, a crosslinking agent using urea is referred to as a urea-based crosslinking agent, a crosslinking agent using an alkyleneurea such as ethyleneurea or propyleneurea is referred to as an alkyleneurea-based crosslinking agent, and a crosslinking agent using glycol urile is referred to as a glycol urile-based crosslinking agent.

The crosslinking agent is preferably at least one kind selected from the group consisting of a melamine-based crosslinking agent, a urea-based crosslinking agent, an alkyleneurea-based crosslinking agent and a glycol urile-based crosslinking agent, among of which a glycol urile-based crosslinking agent is particularly preferable.

Examples of the melamine-based crosslinking agent includes a compound obtained by reacting melamine with formaldehyde to substitute hydrogen atoms of an amino group with hydroxymethyl groups, and a compound obtained by reacting melamine with formaldehyde and a lower alcohol to substitute hydrogen atoms of an amino group with lower alkoxymethyl groups. Specific examples thereof include hexamethoxymethylmelamine, hexaethoxymethylmelamine, hexapropoxymethylmelamine, and hexabutoxybutylmelamine, among which hexamethoxymethylmelamine is preferable.

Examples of the urea-based crosslinking agent include a compound obtained by reacting urea with formaldehyde to substitute hydrogen atoms of an amino group with hydroxymethyl groups, and a compound obtained by reacting urea with formaldehyde and a lower alcohol to substitute hydrogen atoms of an amino group with lower alkoxymethyl groups. Specific examples thereof include bismethoxymethylurea, bisethoxymethylurea, bispropoxymethylurea, and bisbutoxymethylurea, among which bismethoxymethylurea is preferable.

A compound (F-2) described hereinafter is also preferable.

The alkyleneurea-based crosslinking agent includes a group represented by the following general formula (F-0-2):

[Chemical Formula 24]

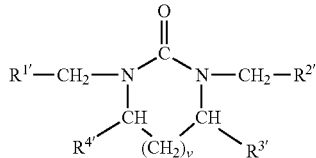

(F-0-2)

wherein $R^{1\prime}$ and $R^{2\prime}$ each independently represents a hydroxyl group or a lower alkoxy group, $R^{3\prime}$ and $R^{4\prime}$ each independently represents a hydrogen atom, a hydroxyl group or a lower alkoxy group, and v represents an integer of 0, 1, or 2.

When $R^{1\prime}$ and $R^{2\prime}$ are lower alkoxy groups, they are preferably alkoxy group having 1 to 4 carbon atoms, and may be linear or branched. $R^{1\prime}$ and $R^{2\prime}$ may be the same or different from each other, and are more preferably the same.

When $R^{3\prime}$ and $R^{4\prime}$ are lower alkoxy groups, they are preferably from alkoxy groups having 1 to 4 carbon atoms, and may be linear or branched. $R^{3\prime}$ and $R^{4\prime}$ may be the same or different from each other, and are more preferably the same.

v is an integer of 0, 1, or 2, and is preferably 0 or 1.

The alkyleneurea-based crosslinking agent is particularly preferably a compound in which v is 0 (ethyleneurea-based crosslinking agent) and/or a compound in which v is 1 (propyleneurea-based crosslinking agent).

The compound represented by the general formula (F-0-2) can be obtained by the condensation reaction of an alkyleneurea with formaldehyde, or can be obtained by reacting the above product with a lower alcohol.

Specific examples of the alkyleneurea-based crosslinking agent include an ethyleneurea-based crosslinking agent such as mono- and/or dihydroxymethylated ethyleneurea, mono- and/or dimethoxymethylated ethyleneurea, mono- and/or diethoxymethylated ethyleneurea, mono- and/or dipropoxymethylated ethyleneurea, or mono- and/or dibutoxymethylated ethyleneurea; a propyleneurea-based crosslinking agent such as mono- and/or dihydroxymethylated propyleneurea, mono- and/or dimethoxymethylated propyleneurea, mono- and/or diethoxymethylated propyleneurea, mono- and/or dipropoxymethylated propyleneurea, or mono- and/or dibutoxymethylated propyleneurea; 1,3-di(methoxymethyl)-4,5-dihydroxy-2-imidazolidinone; and 1,3-di(methoxymethyl)-4,5-dimethoxy-2-imidazolidinone.

The glycol urile-based crosslinking agent includes a glycol urile derivative in which N-position is substituted with either or both of a hydroxyalkyl group and an alkoxyalkyl group having 1 to 4 carbon atoms. Such a glycol urile derivative can be obtained by the condensation reaction of glycol urile with formaldehyde, or reacting the above product with a lower alcohol.

Specific examples of the glycol urile-based crosslinking agent include mono-, di-, tri- and/or tetrahydroxymethylated glycol urile, mono-, di-, tri- and/or tetramethoxymethylated glycol urile, mono-, di-, tri- and/or tetraethoxymethylated glycol urile, mono-, di-, tri- and/or tetrapropoxymethylated glycol urile, mono-, di-, tri- and/or tetrabutoxymethylated glycol urile, and mono-, di-, tri- and/or tetrapentoxymethylated glycol urile.

A compound (F-3) described hereinafter is also preferable.

Also, the crosslinking agent preferably contains at least one kind selected from the group consisting of the following compounds (F-1), (F-2) and (F-3):

[Chemical Formula 25]

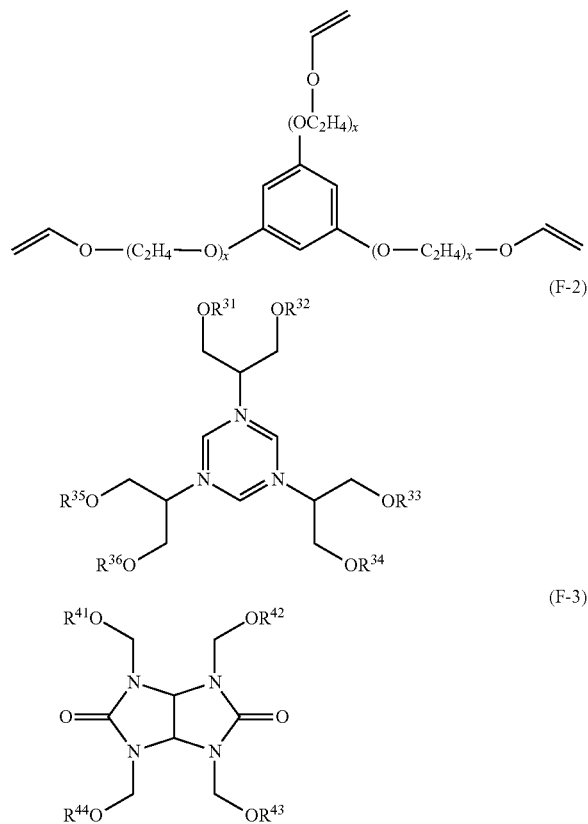

wherein x represents an integer of 0 to 2; $R^{31}$ to $R^{36}$ each independently represents an alkyl group having 5 or less carbon atoms; and $R^{41}$ to $R^{44}$ each independently represents an alkyl group having 5 or less carbon atoms.

In the compound (F-1), x is preferably 0.

Also, the compound (F-1) is preferably a compound represented by the following chemical formula (F-1-1).

[Chemical Formula 26]

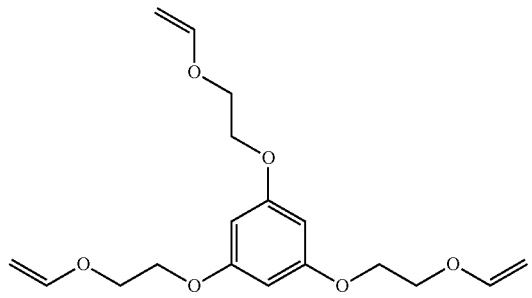

In the compound (F-2), $R^{31}$ to $R^{36}$ each independently represents an alkyl group having 5 or less carbon atoms which may be linear or branched. $R^{31}$ to $R^{36}$ may be the same or different from each other, and all of $R^{31}$ to $R^{36}$ are preferably the same. At least one of $R^{31}$ to $R^{36}$ is preferably a methyl group, and more preferably all of $R^{31}$ to $R^{36}$ are methyl groups.

In the compound (F-3), $R^{41}$ to $R^{44}$ each independently represents an alkyl group having 5 or less carbon atoms which may be linear or branched. $R^{41}$ to $R^{44}$ may be the same or different from each other and all of $R^{41}$ to $R^{44}$ are preferably the same. At least one of $R^{41}$ to $R^{44}$ is preferably a methyl group, and more preferably all of $R^{41}$ to $R^{44}$ are more preferably methyl groups.

When the structure of the crosslinking agent contains a structure having plasma etching resistance, such as cyclic structure or conjugated double bond structure, etching resistance can be more improved. Compounds (F-1) to (F-3) are typical examples thereof.

Also, the crosslinking agent listed above is composed of carbon, hydrogen and nitrogen atoms, but is not limited thereto. For example, the structure listed above may be partially substituted with fluorine or chlorine. Also, the structure listed above may have a group containing silicon such as $(CH_3)_3Si$—.

The crosslinking agent may be used alone, or two or more kinds of them may be used in combination.

When the crosslinking agent is contained, it is possible to obtain a better effect than when a conventional etching resistance improver which has a cyclic structure such as a benzene ring and is not crosslinkable is contained.

Also, the crosslinking agent can be used as a mixture with a "supercritical fluid", or a "supercritical fluid precursor solution" (hereinafter generically referred to as a "solvent" for convenience) in a liquid phase state before converting into a supercritical fluid, such as liquefied $CO_2$.

The crosslinking agent can also be dissolved in a proper organic solvent and mixed with the "solvent".

The organic solvent can be used without any limitation as long as it can dissolve the crosslinking agent, and specifically, a nonpolar solvent typified by hydrocarbon such as normal hexane, and a polar solvent such as ethyl alcohol can be used.

Together with the crosslinking agent, "other components" excluding the crosslinking agent can be mixed with a "solvent", and then they can be introduced into a resist pattern.

As an example of "other components", a reaction accelerator (catalyst) for accelerating the crosslinking reaction is preferable.

As the catalyst, for example, the same one as the acid generator component (B) can be used. In the case of mixing the acid generator component (B), it is necessary to irradiate with light when the crosslinking reaction is accelerated.

A mass molar ratio of the crosslinking agent to the catalyst is preferably from 9:1 to 1:9, more preferably from 8:2 to 2:8, and most preferably about equivalent (for example, 6:4 to 4:6), in view of acceleration of the crosslinking reaction.

In the case of using plural kinds of crosslinking agents or using "other components", these components may be mixed with the "solvent" at a time. Alternatively, a processing solution containing one kind of a crosslinking agent dissolved in the "solvent", and a processing solution containing other crosslinking agents and a catalyst dissolved in the "solvent" are separately prepared, are each introduced into a high pressure vessel, and then are mixed in the high pressure vessel.

The crosslinking agent is mixed with a "supercritical fluid precursor solution" and the mixture is used as a "supercritical precursor processing solution". Alternatively, the crosslinking agent is mixed with a "supercritical fluid" and the mixture is used as a "supercritical processing solution". The solutions are sometimes generically referred to as a "processing solution". The concentration of the crosslinking agent in the processing solution is not specifically limited as long as it can be dissolved in the supercritical precursor fluid or the supercritical fluid, and is from 0.01 to 10% by mass, preferably from about 0.1 to 1% by mass, and more particularly from about 0.01 to 0.1% by mass, relative to each processing solution. The concentration of the crosslinking agent relative to the resist pattern is from about 10 to 20% by mass, and particularly about 20% by mass, so as to improve etching resistance.

Operation of Bringing Supercritical Processing Solution in Contact with Resist Pattern The resist pattern obtained in the above step [1] is, for example, brought into contact with a supercritical processing solution in the following manner. The operation will be described by the following procedure with reference to FIG. 1 and FIG. 2A to FIG. 2C.

FIG. 1 is a graph showing schematically a vapor-liquid equilibrium curve of a fluid. In the figure, the point A denotes a critical point. In the case of carbon dioxide, it corresponds to a point of Tc=31.1° C. and Pc=7.38 MPa.

Figure 2A:
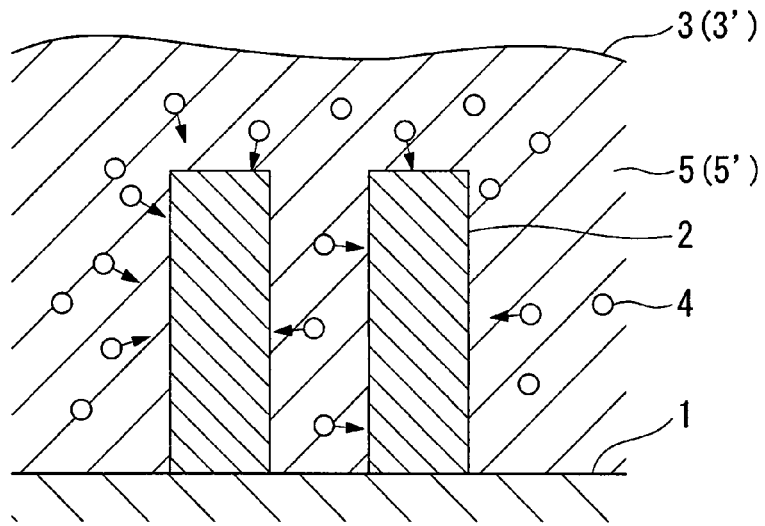
FIG. 2A to FIG. 2C are schematic views explaining a method of bringing a resist pattern into contact with a supercritical processing solution.
Figure 2B:
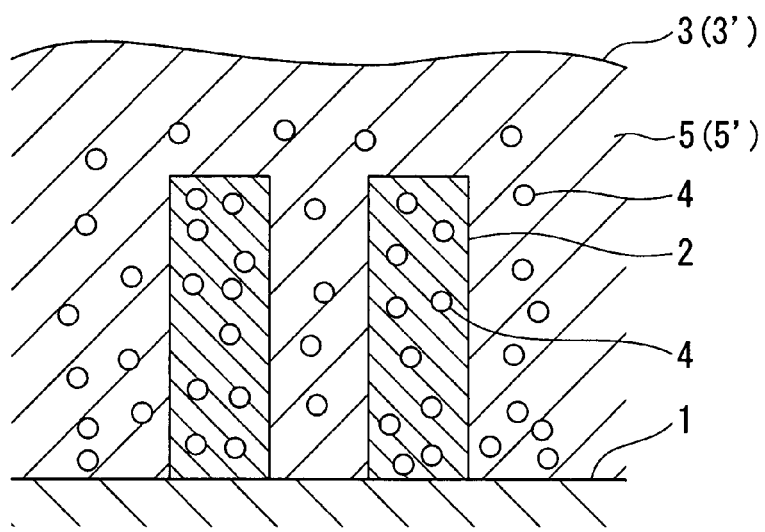
Figure 2C:
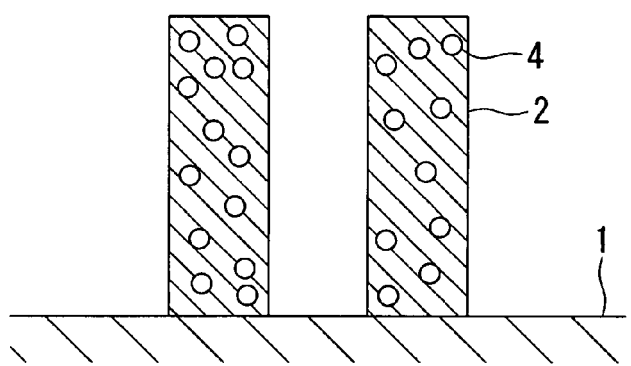

FIG. 2A to FIG. 2C are schematic views explaining a method of bringing a resist pattern into contact with a supercritical processing solution.

(1) First, as shown in FIG. 2A, a substrate 1 on which a resist pattern 2 is formed is placed in a high pressure vessel, which can endure the temperature and the pressure enough to bring into a supercritical state. In this example, the resist pattern 2 on the substrate 1 is maintained in the state of being wetted with a rinsing solution after the development.

Then, the high pressure vessel is closed air-tight. At this time, the temperature and the pressure in the high pressure vessel are brought into the state of room temperature (for example, 23° C.) and atmospheric pressure (point (1) in FIG. 1).

(2) Then, the temperature and pressure in the high pressure vessel are adjusted to the condition (for example, point (2) in FIG. 1) which brings $CO_2$ into a liquid phase, for example, at the pressure of about 6 MPa. In this high pressure vessel, a supercritical precursor fluid in which a crosslinking agent is not dissolved (liquefied $CO_2$), is forcibly fed and also the residual atmosphere is discharged through a discharge section of the high pressure vessel. This operation is continued for about 5 minutes.

As a result, in the high pressure vessel, a rinsing solution, with which a resist pattern 2 is wetted, is replaced by a supercritical precursor fluid, and thus the high pressure vessel is filled with the supercritical precursor fluid, thereby removing the rinsing solution. In the case of replacing the rinsing solution, for example, replacement efficiency may be improved by using a surfactant in the rinsing solution.

(3) Then, the interior of the high pressure vessel is brought into a supercritical state. Specifically, the interior of the high pressure vessel is once adjusted to the temperature and the pressure which brings the supercritical precursor fluid into a supercritical state (for example, point (3) in FIG. 1, specifically, condition of 35° C. to 50° C. (particularly 35° C.) and 20 MPa). When the temperature is higher than a critical point, a diffusion coefficient increases, and thus it is possible to penetrate a crosslinking agent into the film deeply and quickly. The pressure is preferably higher than a critical point, because the density increases and solubility of the crosslinking agent increases. In the case of using carbon dioxide, the pressure is from 10 to 20 MPa, and particularly from 15 to 20 MPa.

In the case of using carbon dioxide, liquefied $CO_2$ in a liquid phase state can be brought into a supercritical state by adjusting the interior of the high pressure vessel to 31.1° C. or higher and 7.38 MPa or higher.

Although it depends on the kind of the supercritical fluid, in the case of carbon dioxide, solubility does not vary when the pressure is higher than 20 MPa, thus there is less merit in increasing the pressure to the pressure of higher than 20 MPa.

In the case of bringing the supercritical precursor fluid into a critical state, it is preferred to bring into the supercritical state by adjusting the temperature to a critical temperature or higher and adjusting the pressure to a critical pressure or higher. However, the same effect can be obtained, even when the supercritical precursor fluid is brought into a subcritical state closer to a supercritical state where the temperature is lower than the critical temperature and/or the pressure is less than the critical pressure.

(4) As shown in FIG. 2A, while maintaining a supercritical state, a supercritical precursor processing solution 5 prepared by dissolving a crosslinking agent 4 in a supercritical precursor fluid 3 is introduced into the high pressure vessel.

As a result, the supercritical precursor processing solution 5 in which the crosslinking agent 4 is dissolved is filled in the vicinity of the resist pattern 2, the high pressure vessel becomes in a supercritical state, and thus this supercritical precursor processing solution 5 is converted into a supercritical processing solution 5' in which the crosslinking agent 4 is dissolved in a supercritical fluid 3' in the high pressure vessel.

In such a manner, it is possible to bring the resist pattern 2 into contact with the supercritical processing solution 5' and to dip the resist pattern 2 in the supercritical processing solution 5'.

When allowed to stand for a predetermined time (for example, about 5 minutes), as shown in FIG. 2B, the crosslinking agent 4 in the supercritical processing solution 5' penetrates into the resist pattern 2.

At this time, the crosslinking agent 4 diffuses into the resist pattern in a state (cluster state) of being surrounded with carbon dioxide.

(5) Next, when the pressure is gradually decreased as shown in FIG. 2C, only the supercritical fluid 3' in the supercritical processing solution 5 is expelled from the high pressure vessel and then vaporized. Consequently, the pressure in the high pressure vessel decreases (for example, decreases to about 7.5 MPa), resulting in the temperature and the pressure indicated by the point (4) in FIG. 1. Therefore, the supercritical fluid 3' in the vicinity of the resist pattern 2 is removed in a vapor phase state, and the resist pattern 2 is dried.

Then, the interior of the high pressure vessel is optionally cooled to room temperature.

Consequently, as shown in FIG. 2C, the crosslinking agent 4 is introduced and the dispersed resist pattern 2 is obtained in a dried state.

In the case of performing a processing of decreasing the pressure in the high pressure vessel in the final stage of the step [2], it is possible to perform a processing in which the crosslinking agent 4 introduced preliminarily into the resist pattern 2 does not turn back to the exterior of the resist pattern 2. This method is referred to as a keeping method.

It is particularly effective when a large amount of the crosslinking agent 4 is introduced.

For example, the following keeping methods are performed.

(Keeping Method 1) As shown in FIG. 2B, a crosslinking agent 4 is penetrated into a resist pattern 2 Then, a supercritical precursor fluid which does not easily dissolve a crosslinking agent (hereinafter referred to as an "inert supercritical precursor fluid" for convenience) is introduced into the high pressure vessel, and also a supercritical processing solution 5' is discharged. As a result, the "inert supercritical precursor fluid" introduced into the high pressure vessel is brought into a fluid in a supercritical state (hereinafter referred to as an "inert supercritical fluid" for convenience). Consequently, the concentration of the crosslinking agent 4 in the high pressure vessel can be decreased.

That is, since the "inert supercritical fluid" in which the crosslinking agent 4 has comparatively low solubility is filled in the vicinity of the resist pattern 2 into which the crosslinking agent 4 is introduced, it is possible to prevent the crosslinking agent 4 introduced into the resist pattern 2 from expelling from the resist pattern 2 again.

Then, the "inert supercritical fluid" is expelled and the pressure in the high pressure vessel is lowered.

The "inert supercritical fluid" suited for these applications is preferably an inert gas such as helium, xenon or nitrogen, and particularly preferably helium, because solubility of the crosslinking agent is comparatively low, and a supercritical point is comparatively low as compared with carbon dioxide or a fluorine compound, and thus it is easily brought into a supercritical state.

Specifically, for example, as the "inert supercritical precursor fluid", helium pressurized to about 10 MPa to 20 MPa is preferably introduced into the high pressure vessel, whereby, supercritical helium ("inert supercritical fluid") is filled in the high pressure vessel, and the supercritical fluid 3' and excess crosslinking agent 4 in the high pressure vessel are discharged.

(Keeping Method 2) As shown in FIG. 2B, a crosslinking agent 4 is penetrated into a resist pattern 2 and then the pressure in the high pressure vessel is reduced to the minimum pressure at which a supercritical state can be maintained.

Then, the same supercritical precursor fluid 3 as that used in the introduction of the crosslinking agent 4 is introduced into the high pressure vessel in the state where the crosslinking agent is not dissolved. This precursor solution is converted into a supercritical fluid 3' in the high pressure vessel.

The density of the supercritical fluid 3' in the high pressure vessel is decreased by adjusting to the minimum pressure. Consequently, solubility of the crosslinking agent 4 can be decreased.

Then, the supercritical fluid is expelled and the pressure in the high pressure vessel is decreased.

(Keeping Method 3) As shown in FIG. 2B, a crosslinking agent 4 is penetrated into a resist pattern 2 and the inner temperature of the high pressure vessel was adjusted to a critical point or lower, and then the supercritical fluid 3' is expelled in a state of a supercritical precursor fluid 3.

(Keeping Method 2) and (Keeping Method 3) are simple and easy methods because a supercritical fluid which is different from that used in the case of introducing the crosslinking agent 4, such as helium, is not used.

In this example, the operation of replacing the "rinsing solution with which the resist pattern 2 is wetted" by the "supercritical precursor fluid in which a crosslinking agent is not dissolved" was performed in advance, but can also be omitted.

That is, the resist pattern 2 is placed in the high pressure vessel and then a "supercritical precursor fluid in which a crosslinking agent is dissolved" (supercritical precursor processing solution) is introduced in the high pressure vessel. At this time, the rinsing solution, with which the resist pattern 2 is wetted, is replaced by a supercritical precursor in the presence of a crosslinking agent.

Also, the processing can be performed without using the supercritical precursor fluid.

That is, a supercritical fluid, which is brought into a supercritical state outside the high pressure vessel, is supplied to the high pressure vessel adjusted to the temperature and pressure conditions of a supercritical state.

In the above example, processing was performed in the state where the resist pattern is wetted, but a resist pattern may preliminarily be dried, and subsequently be brought into contact with a supercritical processing solution.

There is a merit that pattern collapse of a fine pattern can be prevented by processing with a supercritical fluid when the resist pattern is in a wet state, followed by drying.

[3] Step for Allowing Crosslinking Reaction to Proceed

The resist pattern 2 which is processed with the supercritical processing solution is preferably subjected to a heat treatment. Consequently, the reaction between the crosslinking agent and the resin component (A), or the reaction between the crosslinking agents proceeds and thus etching resistance can be improved.

Crosslinking means that the side chain of the crosslinking agent is crosslinked, thereby firming molecules. In this case, the crosslinking reaction includes a reaction between the crosslinking agent and materials constituting the resist composition, or a reaction between the crosslinking agents. In this case, since the side chain moieties may be connected, the effect can be obtained even by the reaction between the crosslinking agents even if the crosslinking agent is not reacted with the materials constituting the resist composition.

With respect to the heat treatment, as described above, the heating which is performed to bring into a supercritical state can be utilized. That is, in the step [2], as shown in FIG. 2B to FIG. 2C, if the temperature condition in the operation process of introducing a crosslinking agent 4 into a resist pattern 2 is overlapped with the temperature condition which enables the crosslinking reaction to proceed, the step [2] and the step [3] can be simultaneously performed.

By enabling such a crosslinking reaction to proceed before expelling the supercritical processing solution 5' in the high pressure vessel, it is possible to inhibit a phenomenon in which the crosslinking agent 4 introduced into the resist pattern 2 turns back to the exterior of the resist pattern 2 after introduction.

After the completion of the step [2], this reaction may be performed in an atmospheric environment after drying the resist pattern 2.

Heating condition is adjusted within a range from 80 to 140° C., preferably from 90 to 130° C., and particularly about 110° C.

After irradiating with light, a heat treatment can also be performed. Light used for irradiation includes, for example, radiation such as ultraviolet ray having a wavelength of 500 nm or less or far ultraviolet ray.

[4] Etching Step

Using the resist pattern obtained by the above method as a mask, a substrate is etched by a conventional method. Since an anti-etching agent is dispersed in the resist pattern obtained by the method of the present invention, satisfactory etching resistance is exhibited and thus it is possible to efficiently prevent excess thickness loss or deformation of the pattern upon etching to cause poor processing.

Second Embodiment

The second embodiment of the present invention will now be described.

Figure 3:
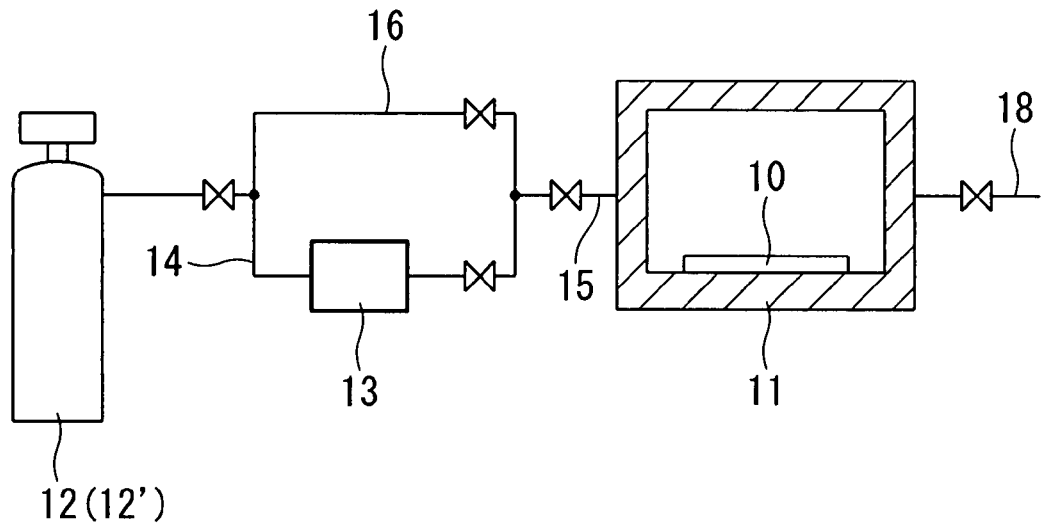
FIG. 3 is an explanatory view of an apparatus used in a method of bringing a resist pattern into contact with a supercritical processing solution.
Figure 4:
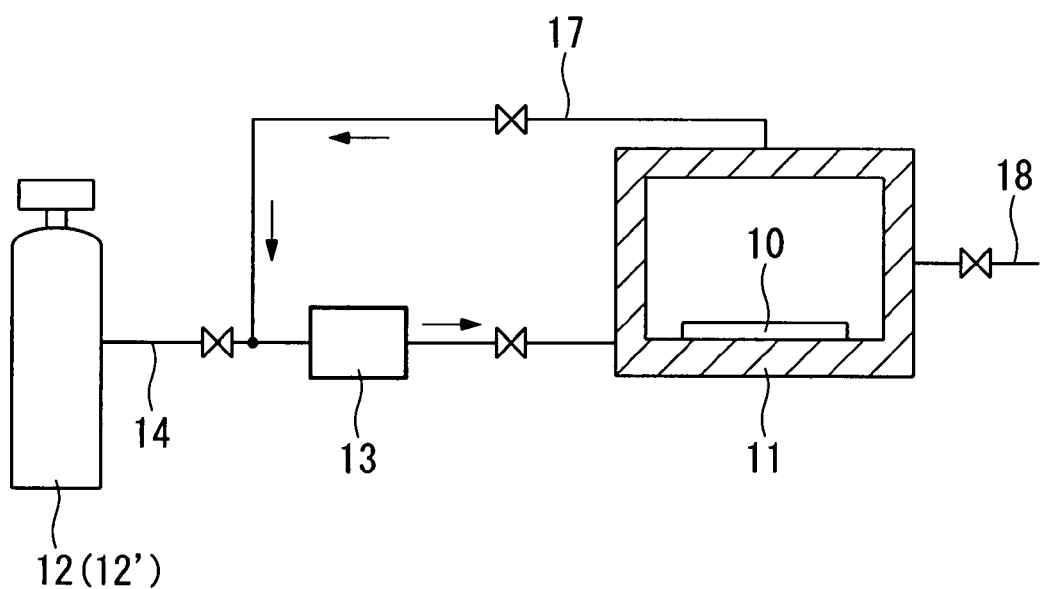
FIG. 4 is an explanatory view of another apparatus used in a method of bringing a resist pattern into contact with a supercritical processing solution.

The second embodiment is different from the first embodiment in the respect that, using apparatuses shown in FIG. 3 and FIG. 4, a supercritical processing solution prepared by mixing a supercritical fluid with a crosslinking agent is directly supplied to the resist pattern.

The apparatus shown in FIG. 3 is equipped with a supercritical processing section 11 composed of a high pressure vessel, and a supercritical fluid supply system 12 which supplies a supercritical fluid. As the supercritical fluid supply system 12, for example, a cylinder or a tank of a supercritical fluid of carbon dioxide are used. The supercritical processing section 11 is equipped with a discharge passage 18.

A passage connected between the supercritical fluid supply system 12 and the supercritical processing section 11 is branched on the way of the upstream side into two passages. One of the branched passages is a crosslinking agent supplying passage 14 with a crosslinking agent supplying section 13, and the other passage is a direct supplying passage 16. The crosslinking agent supplying passage 14 is incorporated with the direct supplying passage 16 again at the downstream side to form a supplying passage 15, which is connected with the supercritical processing section 11.

In the case of performing processing, first, the resist pattern 10 to be processed, which is obtained in the same manner as in the first embodiment, is carried in the supercritical processing section 11.

Then, when the supercritical fluid is supplied from the supercritical fluid supply system 12 to the direct supplying passage 16, only a supercritical fluid can be introduced into the supercritical processing section 11.

At this time, the supercritical processing section 11 is adjusted to temperature and pressure conditions which enable a supercritical state.

In such a way, the supercritical processing section 11 is filled with a supercritical fluid.

Then, when a supercritical fluid is supplied from the supercritical fluid supply system 12 to the crosslinking agent supplying passage 14, crosslinking agents are mixed in the crosslinking agent supplying section 13 which is on the way to the supercritical processing section 11. In such a manner, the supercritical processing solution prepared by mixing the supercritical fluid with the crosslinking agent is supplied to the supercritical processing section 11 through the supplying passage 15.

Consequently, the supercritical processing solution is filled in the vicinity of a resist pattern 10 in the supercritical processing section 11. Then, the crosslinking agent is penetrated into the resist pattern 10.

The crosslinking agent supplying section 13 can also be optionally heated so as to dissolve the crosslinking agent.

It is also possible to use a supercritical precursor fluid supply system 12' in place of the supercritical fluid supply system 12. As the supercritical precursor fluid supply system 12', a cylinder or a tank filled with supercritical fluid precursor solution in a liquid phase state such as liquefied $CO_2$ are used.

In this case, first, a supercritical precursor fluid is introduced and filled from the supercritical precursor fluid supply system 12' to the supercritical processing section 11 through a direct supplying passage 16.

At this time, the supercritical processing section 11 is adjusted to the temperature and pressure conditions on which the supercritical fluid is in a liquid phase.

Then, in the crosslinking agent supplying passage 14, the supercritical precursor processing solution obtained by mixing with the crosslinking agent in the crosslinking agent supplying section 13 is introduced and filled into the supercritical processing section 11.

Then, the supercritical processing section 11 is adjusted to temperature and pressure conditions which enable a supercritical state, and the crosslinking agent is penetrated into the resist pattern.

The apparatus shown in FIG. 3 may have plural crosslinking agent supplying passages 14 equipped with a crosslinking agent supplying section 13 in parallel so as to introduce plural crosslinking agents after mixing.

In the apparatus shown in FIG. 4, a supercritical fluid supply system 12 and a supercritical processing section 11 are connected through a crosslinking agent supplying passage 14 equipped with a crosslinking agent supplying section 13. The supercritical processing section 11 is equipped with a circulating passage 17, and the other end is connected with the upstream side of the crosslinking agent supplying section 13 of the crosslinking agent supplying passage 14.

The supercritical processing solution supplied to the supercritical processing section 11 is extracted at the circulating passage 17 and returned to the crosslinking agent supplying passage 14, and thus supercritical processing solution circulates.

In this apparatus, since the supercritical processing solution is circulated by the circulating passage 17, the concentration of the crosslinking agent in the supercritical processing solution can be stabilized.

In performing the processing, a supercritical fluid is supplied to the crosslinking agent supplying passage 14 from the supercritical fluid supply system 12. As a result, the supercritical fluid is mixed with a crosslinking agent at the crosslinking agent supplying section 13 to obtain a supercritical processing solution, which is supplied to the supercritical processing section 11.

At this time, the supercritical processing section 11 is adjusted to temperature and pressure conditions which enable a supercritical state.

Consequently, the supercritical processing solution is filled in the vicinity of the resist pattern 10 in the supercritical processing section 11. Then, the crosslinking agent is penetrated into the resist pattern 10.

Similar to the apparatus shown in FIG. 3, a supercritical precursor fluid supply system 12' can also be used in place of the supercritical fluid supply system 12. That is, after introducing the precursor processing solution into the supercritical processing section 11, the supercritical processing section 11 is brought into a supercritical state, thereby making it possible to penetrate the crosslinking agent into the resist pattern 10.

The apparatus shown in FIG. 4 may have plural crosslinking agent supplying passages 14 equipped with a crosslinking agent supplying section 13 in parallel so as to introduce plural crosslinking agents after mixing.

Furthermore, the crosslinking agent supplying section 13 is omitted and the crosslinking agent is separately introduced into the supercritical processing section 11, and then the crosslinking agent can be mixed with a supercritical fluid (or supercritical precursor fluid) in the supercritical processing section 11.

In the apparatuses shown in FIG. 3 and FIG. 4, the following operation can also be performed.

That is, the crosslinking agent is preliminarily charged in a supercritical fluid supply system 12 (for example, a tank or a cylinder). Then, a supercritical fluid is introduced into this supercritical fluid supply system 12. Then, a processing solution is prepared by dissolving the crosslinking agent in the supercritical fluid and the resulting processing solution can be introduced into the supercritical processing section 11.

Also in this case, the supercritical precursor fluid supply system 12' is replaced by the supercritical fluid supply system 12, thereby making it possible to dissolve the crosslinking agent in the supercritical precursor fluid.

At this time, the crosslinking agent supplying section 13 can be omitted. This method is simple and easy and is therefore preferable.

In this case, it is necessary to always introduce the crosslinking agent into the supercritical fluid supply system 12 before or during the supercritical processing.

Also, when a large amount of the crosslinking agent is introduced into the supercritical fluid supply system 12, the concentration of the crosslinking agent in the supercritical processing solution is high in an initial stage. As the crosslinking agent in the supercritical fluid supply system 12 is gradually consumed, the concentration of the crosslinking agent in the supercritical processing solution may decrease, and thus a problem such as productivity loss may arise according to the processing time and uses.

To prevent such a problem, it is possible to use a method that a supercritical processing solution prepared by dissolving a given amount of a crosslinking agent in a supercritical fluid is enclosed in a supercritical fluid supply system 12 (for example, a cylinder or a tank).

Alternatively, it is possible to use a method that a supercritical precursor processing solution prepared by dissolving a given amount of a crosslinking agent in a supercritical precursor fluid is enclosed in a supercritical precursor fluid supply system 12' (for example, a cylinder or a tank).

The supercritical processing solution can be directly introduced into the supercritical processing section 11 from the supercritical fluid supply system 12. Alternatively, the supercritical precursor fluid can be directly introduced into the supercritical processing section 11 from the supercritical precursor fluid supply system 12'.

At this time, the amount of the processing solution to be introduced into the resist pattern can be controlled, and thus a processing solution containing a constant concentration of the crosslinking agent is preferably used. Until the processing solution in the supercritical fluid supply system 12 (supercritical precursor fluid supply system 12') is consumed, a processing solution having a constant concentration can be stably supplied.

In the case of using after enclosing the precursor processing solution in the supercritical precursor fluid supply system 12', before and after introducing precursor processing solution into the supercritical processing section 11 from the supercritical precursor fluid supply system 12', supercritical processing is performed after the interior of the supercritical processing section 11 is brought into a supercritical state, as described above.

As described above, in the present invention, etching resistance can be improved by introducing the crosslinking agent into the resist pattern through supercritical processing. As a result, it is possible to form a fine resist pattern which has high accuracy and is excellent in etching resistance. Therefore, even if etching is performed, thickness loss of the resist pattern can be prevented, and thus a satisfactory pattern can be formed on a substrate made of silicon and the like.

According to the present invention, since a crosslinking agent is introduced after forming a resist pattern through exposure and development, etching resistance can be improved without adversely affecting a conventional process. Also, etching resistance can be improved without adversely affecting the composition of the resist composition.

If a compound having an absorption to ArF excimer laser such as a benzene ring is used in a resist composition, and the resist composition is mixed with a crosslinking agent, followed by exposure and further development to form a pattern, there may arise a problem, in conventional methods, that a desired pattern cannot be formed because the compound absorbs an exposure light.

To the contrary, in the present invention, since a crosslinking agent is processed with a supercritical fluid after forming a resist pattern, formation of a resist pattern up to development can be performed by a conventional method and processing with a supercritical fluid does not exert an adverse influence on the formation of a pattern.

Therefore, it is possible to impart etching resistance during the development and etching steps without adversely affecting other properties.

Particularly, a resist composition for ArF excimer laser has a problem that it is inferior in etching resistance because it is composed of an acryl-based resin, therefore a large effect can be obtained by applying the present invention.

Also, when the present invention is applied, it is possible to introduce comparatively large amount of a crosslinking agent into a resist pattern. When the crosslinking agent is preliminarily mixed with the resist composition, the addition amount is limited in view of solubility in a solvent and balance with other components. To the contrary, in the present invention, since the crosslinking agent can be introduced after forming the pattern, there is no limitation as described above.

Examples

Resist Composition

A Resist Composition Including an Acryl-Based Resin

Using a resist composition for ArF excimer laser which includes an acryl-based resin composed of the following components, the following test was performed, and the effect of the present invention was confirmed.

Resin component (A): 100 parts by mass

A resin of the following chemical formula (V) was used. A molar ratio p:q:r is 4:4:2.

[Chemical Formula 27]

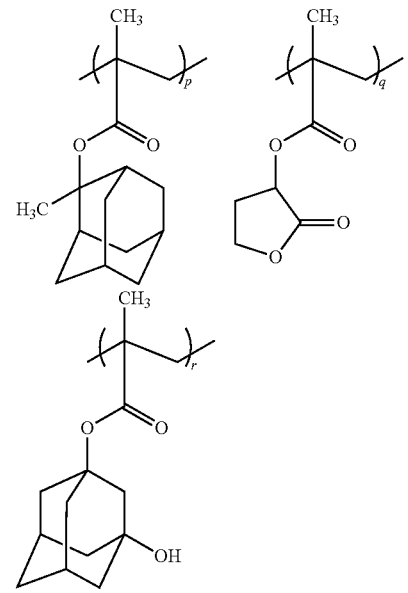

Component (B)

2.5 parts by mass relative to 100 parts by mass of the component (A) Substance name: triphenylsulfonium nonafluorobutane sulfonate Component (D)

0.2 parts by mass relative to 100 parts by mass of the component (A) Substance name triethanolamine The above components were dissolved in propylene glycol monomethyl ether acetate to prepare a resist composition having a solid content of about 8% by mass.

Only in the case of a "test 3", a resist composition including a resin component having a hydroxystyrene skeleton was used.

[Crosslinking Agent]

Crosslinking agent 1: compound represented by the formula (F-1-1)

Crosslinking agent 2: compound of the compound (F-2) in which all of $R^{31}$ to $R^{36}$ are methyl groups Crosslinking agent 3: compound of the compound (F-3) in which all of $R^{41}$ to $R^{44}$ are methyl groups

[Supercritical Fluid]

Carbon dioxide was used.

[Formation of Resist Pattern and Supercritical Processing]

(1) Processing Using Crosslinking Agent 1

First, an organic antireflection film ARC29 (trade name, manufactured by Brewer Science, Inc.) was formed with a thickness of 77 nm on a silicon substrate. Then, the resist composition prepared above was spin-coated and heated at 130° C. for 90 seconds to form a resist film having a thickness of 300 nm.

The resist film was subjected to exposure of a predetermined pattern image using ArF excimer laser as a light source, subjected to post exposure baking at 130° C. for 90 seconds and then developed with an aqueous 2.38 mass % TMAH (tetramethylammonium hydroxide) solution to form a resist pattern.

In this example, a line-and-space pattern having a width of 90 nm was formed.

After the development, a water-rinsing treatment for terminating the development was performed, followed by spun drying.

Then, the patterned silicon substrate was placed on a plate in a high pressure-resistant closed vessel (high pressure vessel), and the vessel was closed air-tight. A temperature in the vessel was controlled to 35° C.

Then, a processing solution prepared by dissolving a crosslinking agent 1 in supercritical carbon dioxide (concentration of a crosslinking agent 1 is about 10% by mass) was introduced into the high pressure vessel. The processing solution was forcibly fed in the high pressure vessel using a pump. The pressure in the high pressure vessel was controlled to 15 MPa, and then this state was maintained for 5 minutes.

Subsequently, supercritical carbon dioxide in which no crosslinking agent 1 was dissolved was introduced into the high pressure vessel, and crosslinking agent 1, which was not introduced in the resist pattern, was flushed.

By these steps, the crosslinking agent 1 is uniformly introduced into the resist pattern.

Then, the pressure in the high pressure vessel was gradually decreased to an atmospheric pressure, and the plate on which the silicon substrate was placed was heated to 120° C., thereby accelerating the crosslinking reaction of the crosslinking agent 1.

(2) Treatment Using "Crosslinking Agent 2"

In the same manner as in the treatment using the (1) "crosslinking agent 1", a resist pattern was formed, the resist pattern was placed in a pressure vessel, and the vessel was closed air-tight. The temperature was controlled to 35° C.

A crosslinking agent 2 was dissolved in supercritical carbon dioxide, together with a diazomethane-based acid generator component (bis(cyclohexylsulfonyl)diazomethane), and this processing solution was introduced into the high pressure vessel. The concentration of the crosslinking agent 2 in the processing solution was 10% by mass and the concentration of the acid generator component was 10% by mass.

The processing solution was forcibly fed in the vessel using a pump. The pressure in the high pressure vessel was controlled to 15 MPa, and then this state was maintained for 10 minutes.

By these steps, the crosslinking agent 2 and the acid generator component are uniformly introduced into the resist pattern.

Then, the pressure in the high pressure vessel was gradually decreased to an atmospheric pressure, and the resist pattern was taken out from the high pressure vessel.

After irradiating with ultraviolet ray for one minute using a mercury xenon lamp, the substrate was heated to 120° C., thereby accelerating the crosslinking reaction of the crosslinking agent 2.

(3) Treatment Using "Crosslinking Agent 3"

In the same manner as in the treatment using the (1) "crosslinking agent 1", a resist pattern was formed, the resist pattern was placed in a pressure vessel, and the vessel was closed air-tight. The temperature was controlled to 35° C.

A crosslinking agent 3 was dissolved in supercritical carbon dioxide, together with triphenylsulfonium nonafluorobutane sulfonate, and this processing solution was introduced into the high pressure vessel. The concentration of the crosslinking agent 3 in the processing solution was 10% by mass, and the concentration of the acid generator component was 10% by mass.

The processing solution was forcibly fed in the vessel using a pump. The pressure in the high pressure vessel was controlled to 20 MPa, and then this state was maintained for 2 minutes.

By these steps, the crosslinking agent 3 and the acid generator component are uniformly introduced into the resist pattern.

Then, the pressure in the high pressure vessel was gradually decreased to an atmospheric pressure, and the resist pattern was taken out from the high pressure vessel.

After irradiating with ultraviolet ray for one minute using a mercury xenon lamp, the substrate was heated to 120° C., thereby accelerating the crosslinking reaction of the crosslinking agent 3.

It was confirmed that, in any case, a fine pattern was formed with high accuracy.

[Test for Confirmation of Introduction of Crosslinking Agent into Resist Pattern]

[Test 1]

Figure 5A:
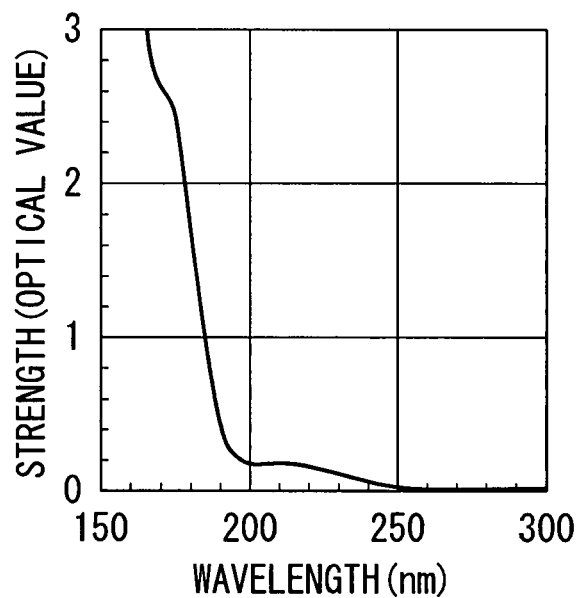
Figure 5B:
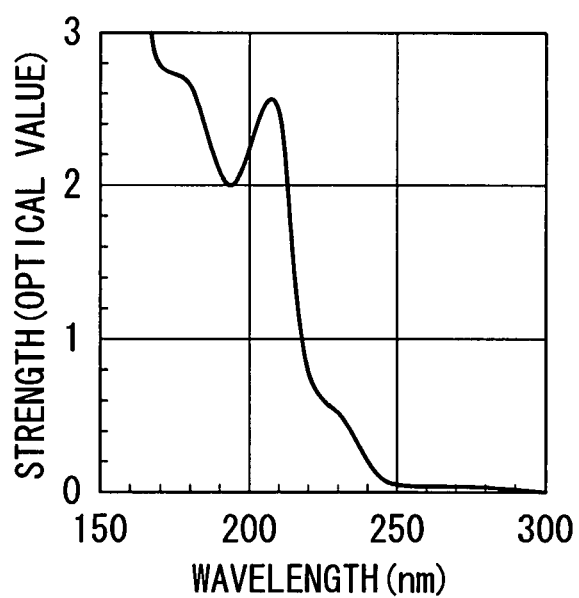

FIGS. 5A and 5B is a graph showing an absorption spectrum of a resist pattern before or after introducing a crosslinking agent 1 into the resist pattern by performing the above supercritical processing using carbon dioxide.

FIG. 5A is a graph showing an absorption spectrum of a resist pattern before introducing a crosslinking agent, and FIG. 5B is a graph showing an absorption spectrum of a resist pattern after introducing a crosslinking agent.

Comparing these drawings, a peak at a wavelength of 210 nm increased in the graph shown in FIG. 5B. This peak attributes to an absorption of a benzene ring which exists in the molecular center of the crosslinking agent 1, and shows that the crosslinking agent 1 is introduced into a resist pattern through supercritical processing. It could be confirmed by the results that the crosslinking agent could be introduced into the resist pattern through supercritical processing.

[Test 2]

FIG. 6 is a graph showing distribution of atoms in a resist pattern film after introducing a crosslinking agent 3 into a resist pattern using the above method.

This graph is referred to as "depth analysis" in which the abscissa axis denotes a distance (depth) from the surface of a resist pattern, whereas, the vertical axis denotes distribution intensity (distribution amount) of atoms. A nitrogen atom represents a nitrogen atom included in a crosslinking agent 3, and shows distribution of the crosslinking agent 3 itself.

As is apparent from FIG. 6, nitrogen atoms are uniformly dispersed in the resist pattern. Namely, it could be confirmed that the crosslinking agent 3 was uniformly introduced into the resist pattern by the above supercritical processing method.

It was also confirmed that the crosslinking agent 2 could also be uniformly introduced into the resist pattern, similarly.

[Test 3]

It is known that molecules having a vinyl group such as the crosslinking agent 1 are likely to be crosslinked with the same kind of molecules.

FIG. 7B is a graph showing an infrared spectrum after introducing about 5% by mass of a crosslinking agent 1 into a resist pattern which is formed by using a resist composition having a polyhydroxystyrene skeleton through the above supercritical processing method, followed by heating at 120° C.

FIG. 7A is a graph showing an infrared spectrum before heating. It is found that, as compared with the spectrum before heating shown in FIG. 7A, in the case of the spectrum after heating shown in FIG. 7B, a peak intensity of about 3,400 $cm^{-1}$, which is a peak intensity of a hydroxyl group, is decreased by a heat treatment.

Since this peak intensity attributed to the hydroxyl group did not vary even if the resist pattern or resist film which was not subjected to the supercritical processing was heated at 120° C., it was found that hydroxyl groups of the hydroxystyrene skeleton were crosslinked with the vinyl group of the crosslinking agent 1 through the processes from introduction of the crosslinking agent to the heat treatment.

On the other hand, as compared with the case of only heating, the crosslinking reaction proceeded furthermore when an acid generator component was introduced into the resist pattern through the supercritical processing method together with the crosslinking agent.

For example, a sample of a crosslinking agent 2 and a sample of a crosslinking agent 3 were mixed with a known acid generator component composed of an onium salt-based acid generator such as sulfonium salt and a diazomethane-based acid generator in an equivalent amount, and the mixed material was dissolved in a supercritical fluid, and then introduced into a resist film. It could be confirmed that, when irradiation with ultraviolet ray and heating were performed at this time, the acid generator component was decomposed to generate an acid and the acid served as a catalyst, thereby increasing the crosslinking reaction rate. It was confirmed that the crosslinking reaction noticeably proceeded, as compared with the case of only heating.

As a result of the test, it was confirmed that nearly equivalent ratio of the crosslinking agent to the acid generator component was effective.

[Test for Confirmation of Etching Resistance Improving Effect]

In the following manner, the etching resistance improving effect was confirmed.

Figure 8:
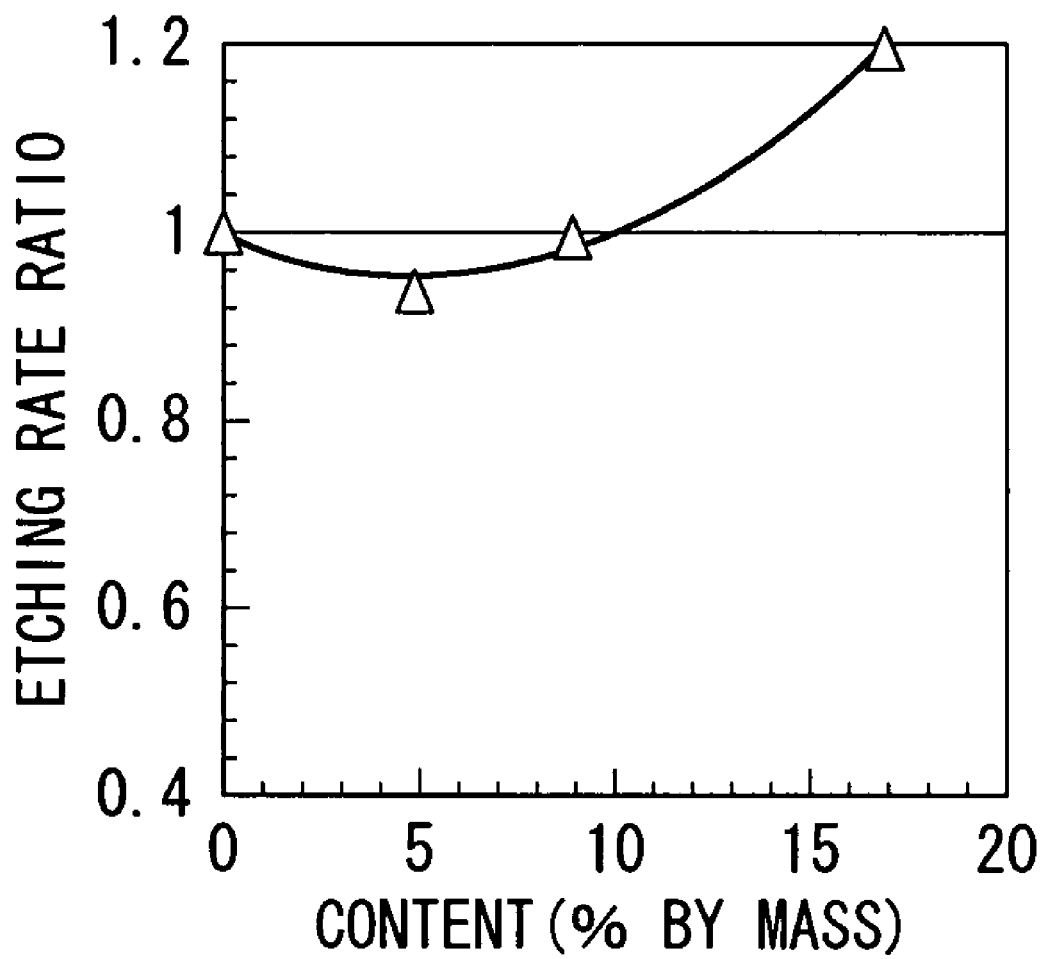
FIG. 8 is a graph showing the results of Examples, in which a crosslinking agent 2 is simply introduced into an acryl-based resist film through supercritical processing and an etching rate of the resist film is examined.

FIG. 8 is a graph showing the results of Examples, in which a crosslinking agent 2 was simply introduced into an acryl-based resist film through supercritical processing and an etching rate of the resist film was examined. In etching, a chlorine gas plasma was used. As a result of examining an additive amount of the crosslinking agent 2 and an etching rate (etching rate ratio: a value expressed by a relative ratio, relative to an etching rate of a resist pattern before introducing a crosslinking agent as 1), the etching rate does not necessarily decreases as the addition amount increases when only the crosslinking agent 2 is added, but increases to the contrary when the addition amount increases. The same tendency was recognized when the crosslinking agent 1 or the crosslinking agent 3 is used.

Therefore, it was found that etching resistance cannot be necessarily improved only by introducing the crosslinking agent.

Figure 9A:
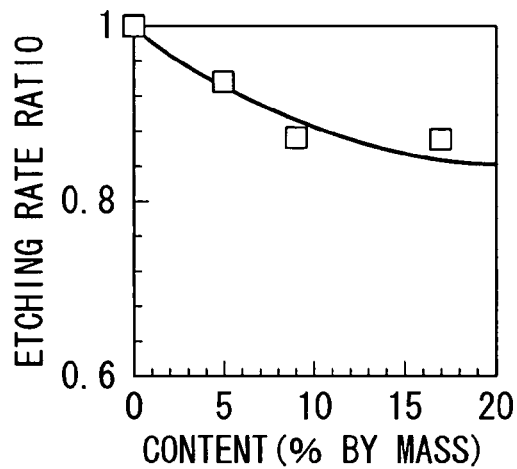
Figure 9B:
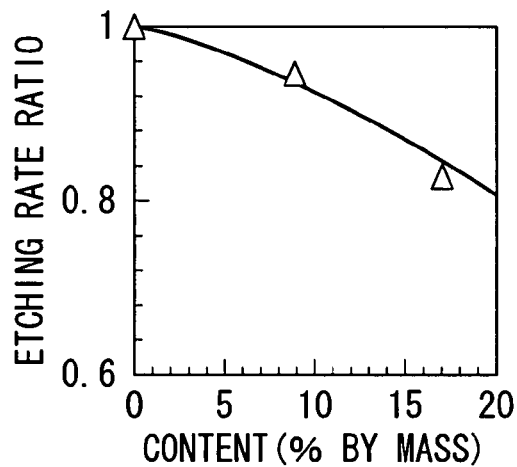
Figure 9C:
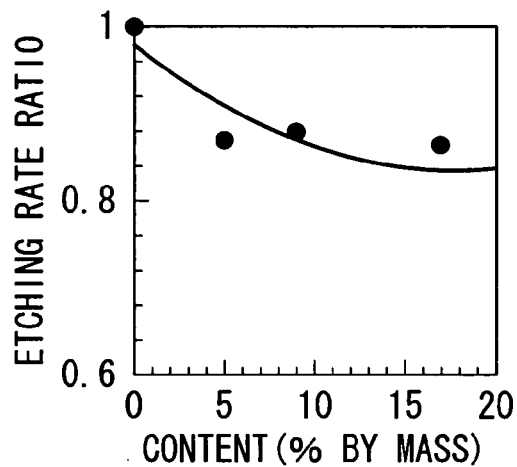

FIG. 9A to FIG. 9C are graphs showing a relationship between the content (abscissa axis) of a crosslinking agent introduced into a resist pattern through supercritical processing and the etching rate ratio (vertical axis).

In etching, chlorine gas plasma was used.

Also, a heat treatment, or a heat treatment and irradiation with radiation were performed so as to enable the crosslinking reaction to proceed.

The content of the crosslinking agent and the etching rate (etching rate ratio: a value expressed by a relative ratio, relative to an etching rate of a resist pattern before introducing a crosslinking agent as 1) were examined.

Correspondence of figures to the kinds of crosslinking agents are as follows.

FIG. 9A: Crosslinking agent 1
FIG. 9B: Crosslinking agent 2
FIG. 9C: Crosslinking agent 3

It was found that the etching rate decreased in all results of FIG. 9A: crosslinking agent 1, FIG. 9B: crosslinking agent 2, and FIG. 9C: crosslinking agent 3.

These patterns means modification to the state with etching resistance was performed, thus it was confirmed thickness loss of the resist pattern was prevented even if the substrate was etched, and a satisfactory silicon pattern could be formed.

The etching rate decreased because the side chain was particularly crosslinked. The etching reaction begins when activated species in the plasma attacks the molecular end. If the crosslinking reaction is not performed, the side chain reacts more simply with the plasma in a free state, and then decomposed. Even if a group having high etching resistance exists in the molecule, the entire molecules are decomposed and etching resistance is not improved because decomposition of the side chain causes continuous intramolecular decomposition reaction. Therefore, in order to improve etching resistance, it is preferred to introduce an etching resistant substance into the resist pattern and to sufficiently perform the crosslinking reaction, thereby connecting the side chains.

INDUSTRIAL APPLICABILITY

According to the present invention, it is possible to provide a fine and high-accuracy pattern, which is excellent in etching resistance.

The invention claimed is:

1. A resist pattern forming method, which comprises:
   forming a resist pattern on a substrate through a lithography technique by using a resist composition which has a photosensitivity to a predetermined light source;
   dissolving a crosslinking agent into a supercritical fluid to form a supercritical processing solution; and
   diffusing the crosslinking agent throughout the resist pattern by bringing the resist pattern formed on the substrate into contact with a supercritical processing solution.

2. The resist pattern forming method according to claim 1, the crosslinking agent contains at least one material selected from the group consisting of a fullerene compound, an amino-based crosslinking agent, and a vinyl-based crosslinking agent.

3. The resist pattern forming method according to claim 2, wherein the amino-based crosslinking agent contains at least one material selected from the group consisting of a melamine-based crosslinking agent, a urea-based crosslinking agent, an alkyleneurea-based crosslinking agent, and a glycol urile-based crosslinking agent.

4. The resist pattern forming method according to claim 2, wherein the vinyl-based crosslinking agent contains a crosslinkable polyvinyl ether compound.

5. The resist pattern forming method according to claim 1, wherein the supercritical processing solution comprising a supercritical fluid which contains a crosslinking agent further comprises an acid generator component.

6. The resist pattern forming method according to claim 1, wherein the crosslinking agent contains at least one material selected from the group consisting of the following compounds (F-1), (F-2), and (F-3):

[Chemical Formula 1]

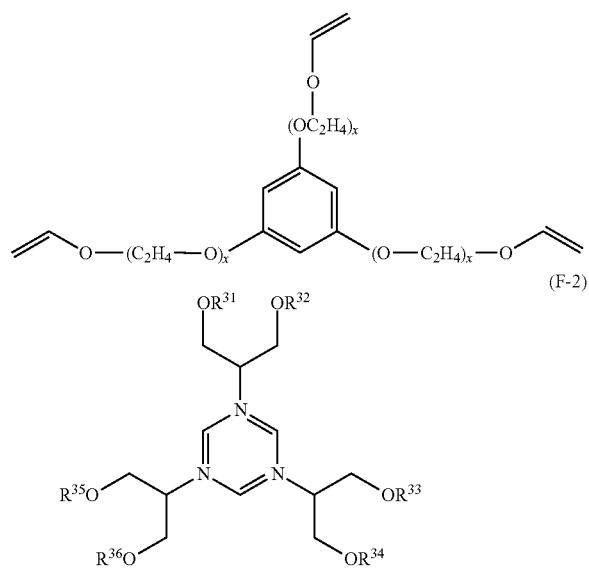

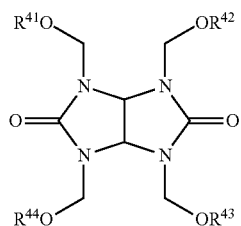

wherein x represents an integer of 0 to 2; $R^{31}$ to $R^{36}$ each independently represents an alkyl group having 5 or less carbon atoms; and $R^{41}$ to $R^{44}$ each independently represents an alkyl group having 5 or less carbon atoms.

7. The resist pattern forming method according to claim 1, wherein the supercritical fluid is prepared by bringing a substance which is vapor in an atmospheric environment into a supercritical state.

8. The resist pattern forming method according to claim 1, wherein a resist pattern is brought into contact with the supercritical processing solution, and then the resist pattern is (1) heated or (2) irradiated with light and is also heated.

9. The resist pattern forming method according to claim 1, which comprises the steps of:
    developing the resist composition to form a resist pattern,
    bringing the resist pattern into contact with the supercritical processing solution after the development treatment, and
    vaporizing a supercritical fluid in the supercritical processing solution.

10. The resist pattern forming method according to claim 1, which comprises the steps of:
    developing the resist composition to form a resist pattern,
    bringing the resist pattern into contact with a supercritical precursor processing solution of the supercritical processing solution after the development treatment,
    bringing the supercritical precursor processing solution into a supercritical state to give a supercritical processing solution, and
    vaporizing a supercritical fluid in the supercritical processing solution.

* * * * *